(12) United States Patent
Abbott et al.

(10) Patent No.: US 8,085,117 B1
(45) Date of Patent: Dec. 27, 2011

(54) SLOTTED BOUNDARY ACOUSTIC WAVE DEVICE

(75) Inventors: Benjamin P. Abbott, Longwood, FL (US); Marc Solal, Longwood, FL (US); Michael Wang, Chiba (JP); Kenya Hashimoto, Funabash (JP)

(73) Assignee: Triquint Semiconductor, Inc., Orlando, FL (US)

( * ) Notice: Subject to any disclaimer, the term of this patent is extended or adjusted under 35 U.S.C. 154(b) by 308 days.

(21) Appl. No.: 12/511,181

(22) Filed: Jul. 29, 2009

(51) Int. Cl.
*H03H 9/25* (2006.01)
*H01L 41/083* (2006.01)
(52) U.S. Cl. .................................... 333/193; 310/313 R
(58) Field of Classification Search .................. 333/133, 333/193, 194, 195, 196; 310/313 R
See application file for complete search history.

(56) References Cited

U.S. PATENT DOCUMENTS

| | | | |
|---|---|---|---|
| 7,323,803 B2 | 1/2008 | Kando | |
| 7,486,001 B2 * | 2/2009 | Kando | 310/313 R |
| 7,573,178 B2 * | 8/2009 | Inoue et al. | 310/313 R |
| 7,830,067 B2 * | 11/2010 | Matsuda et al. | 310/313 R |
| 2005/0162048 A1 | 7/2005 | Solal et al. | |
| 2007/0001549 A1 | 1/2007 | Kando | |
| 2007/0210676 A1 * | 9/2007 | Matsuda et al. | 310/326 |
| 2007/0279153 A1 | 12/2007 | Ruby | |
| 2008/0211344 A1 | 9/2008 | Kando | |
| 2009/0102318 A1 | 4/2009 | Kando | |
| 2009/0108710 A1 | 4/2009 | Brown et al. | |

FOREIGN PATENT DOCUMENTS

WO  03088475  10/2003

OTHER PUBLICATIONS

Shimizu, Y., Irino, T.; "Stoneley Waves Propagating Along an Interface Between Piezoelectric Material and Isotropic Material", Proc. IEEE Ultrason. Symp., 1983; pp. 373-376.

Kando, H., Yamamoto, D., Mimura, M., Shimizu, Oda, A., Shimoda, E., Takata, E., Fuyutsume, T., Kudo, R., and Kadota, M.; "RF Filter Using Boundary Acoustic Wave,"; Proc. IEEE Ultrason. Symp., 2006; pp. 188-191.

Yamanouchi, K., Iwahashi, K., and Shibayama, K., "Piezoelectric Acoustic Boundary Waves Propagating Along the Interface Between $SiO_2$ and $LiTaO_3$,"; IEEE Trans. Sonics and Ultrasonics, vol. Su-25, No. 6, 1978; pp. 384-389.

Hashimoto, K., Wang, Y., Omori, T., Yamaguchi, M., Kadota, M., Dando, H., and Shibahara, T.,; "Piezoelectric Boundary Acoustic Waves; Their Underlying Physics and Applications,"; IEEE Ultrasonics Symposium Proceedings, 2008.

Wang, Y., Hashimoto, K., Omori, T., and Yamaguchi, M., "Analysis of Excitation and propagation of Piezoelectric Boundary Acoustic Waves in Overlay/Metal Grating/Rotated YX-LiNbO_3 Structure," 2008; Joint Japan-USA International Meeting on Acoustic Wave Devices, pp. 53-58.

(Continued)

*Primary Examiner* — Dean O Takaoka
(74) *Attorney, Agent, or Firm* — Allen, Dyer, Doppelt, Milbrath & Gilchrist, P.A.

(57) ABSTRACT

A piezoelectric boundary acoustic wave (PBAW) device includes a slotted dielectric body disposed over one surface of a piezoelectric body and electrodes forming an IDT at the interface between the piezoelectric body and the dielectric body. The thickness of the electrode is set so that the acoustic velocity of the boundary acoustic waves is less than acoustic waves propagating in the piezoelectric body.

35 Claims, 35 Drawing Sheets

OTHER PUBLICATIONS

Yamanouchi. K., and Sato, Y., "Piezoelectric Acoustic Boundary Waves in the Structure of Multilayer Thin Films/Electrode/Piezoelectric Substrates," Journal of Applied Physics, 103, 114105; 2008.

Thalhammer, Robert, Marksteiner, Stephan, "Optimization of BAW Resonator Performance Using Combined Simulation Techniques,"; TALK; Conference, Munich, Germany; Sep. 2-4, 2004; in: Proc. of SISPAD, 2004, 3-211-22468-8; 97-100.

Sato, Yusuke, Malocha, Donald, Yamanouchi, Kazuhiko; "Piezoelectric Boundary Waves in the Structure of A1N/SiO/Electrode/ZnO, A1N/Si Substrate"; Joint Japan-USA International Meeting on Acoustic Wave Devices; Dec. 10-11, 2008.

Clatot, Stanislas, Laude, Vincent, Reinhardt, Alexandre, Wilm, Mikael, Daniau, William, Ballandras, Sylvain; "Sensitivity of Interface Acoustic Waves to the Nature of the Interface"; 2003 IEEE Ultrasonics Symposium; pp. 2126-2129.

Stoneley, R.; " Elastic Waves at the Surface of Separation of Two Solids"; Proc. R. Soc. Lond. A 1924 106; Proceedings of The Royal Society; Mathematical, Physical, and Engineering Sciences;1924; pp. 416-428.

\* cited by examiner

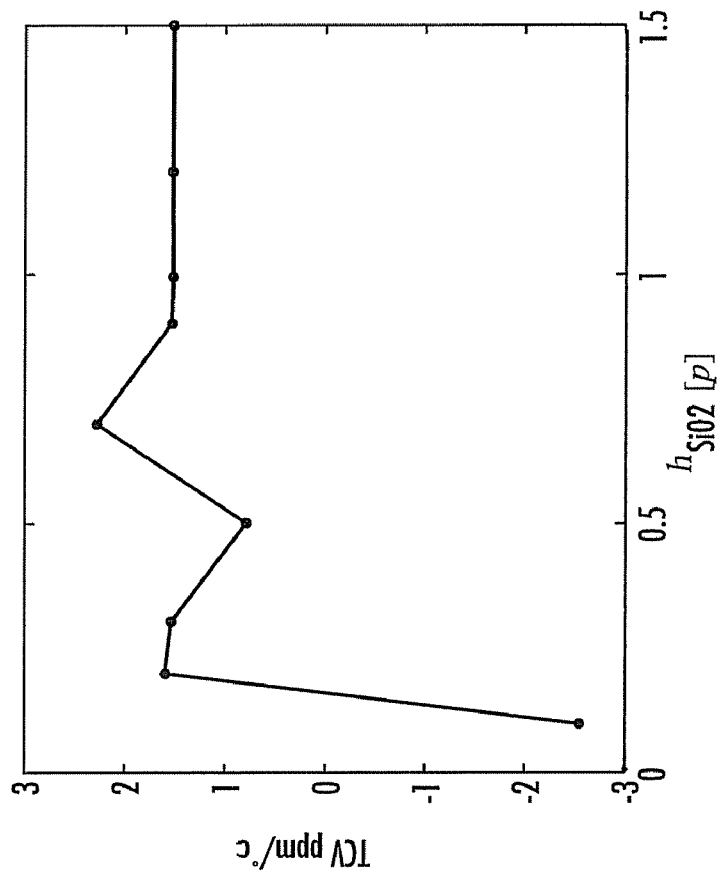
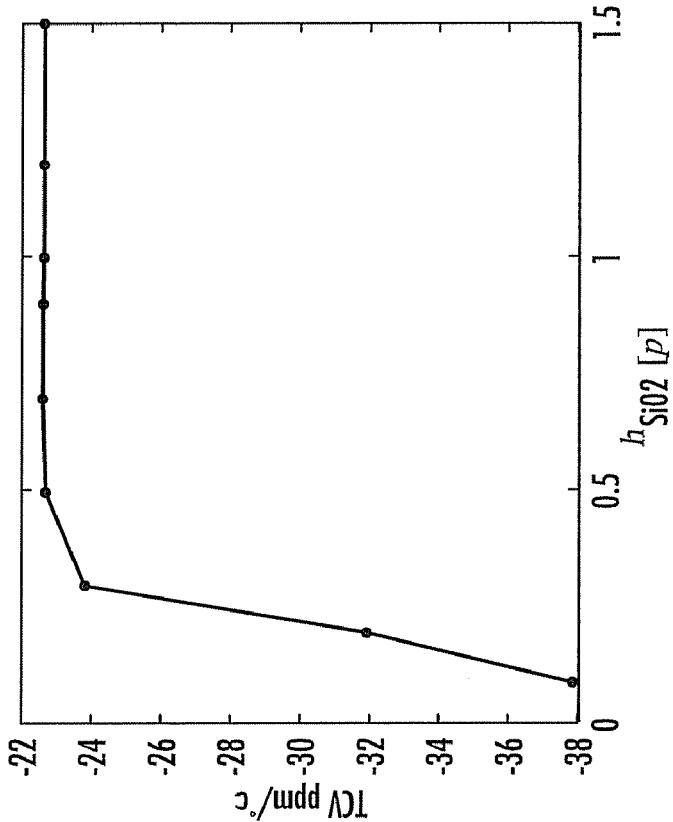
FIG. 29B
FIG. 29A

SLOTTED BOUNDARY ACOUSTIC WAVE DEVICE

FIELD OF INVENTION

The present invention generally relates to boundary acoustic wave devices using substantially shear horizontal (SH) boundary acoustic waves, and in particular to a piezoelectric boundary acoustic wave (PBAW) device including an electrode disposed at a boundary between a piezoelectric body (for example LiNbO3 or LiTaO3) and a slotted body, such as a dielectric, by way of example.

BACKGROUND OF THE INVENTION

Surface acoustic wave filters are successfully used in wireless communication systems. Their filtering function is provided by resonator-type structures, built on piezoelectric substrates with high electromechanical coupling factor. Such devices commonly utilize low-attenuated leaky surface acoustic waves (LSAW) characterized by high electromechanical coupling factor. By way of example, such waves are known to exist in two piezoelectric crystals belonging to the same symmetry class 3m, lithium tantalite ($LiTaO_3$ (LT)) and lithium niobate ($LiNbO_3$ (LN)).

Conventional SAW devices must be hermetically packaged and require air cavity above the surface of the die on which the SAW propagates. In 1924 the Stoneley wave was discovered. The Stoneley wave is tightly bound to the interface between the two solid half-spaces, FIG. 1. The field distribution is entirely composed of two partial waves (longitudinal wave and shear vertical wave) decaying away from the surface in each medium, FIG. 2. A simple illustration of a Stoneley wave propagating in the direction of the x-axis and decaying in along the z-axis is illustrated in FIG. 3.

Reference is made to R. Stoneley, "Elastic waves at the surface of separation of two solids," Roy. Soc. Proc. London, Ser. A, 106, 1924, pp. 416-428, the disclosure of which is herein incorporated by reference.

The polarization of the Stoneley wave, FIG. 2, is dominated by the Shear Vertical (SV) displacement, with a small longitudinal displacement. The Stoneley wave has no Shear Horizontal displacement (SH). The Stoneley wave may be described as a SV type, or more appropriately as a quasi-SV type.

Auld describes the conditions for the existence of Stoneley waves at the interface between two isotropic and between two cubic materials.

Reference is made to B. Auld, "Acoustic Fields and Waves in Solids," Vol. II, Robert E. Krieger Publishing Company, 1990, the disclosure of which is herein incorporated by reference.

Due the underlying physics the Stoneley wave only exists under special conditions and its existence and is very sensitive to the velocities of the Rayleigh and shear waves of the denser medium. For example, in isotropic materials the Stoneley (or Boundary) wave's velocity ($V_B$) may only exist between the velocity of Rayleigh wave ($V_R$) and velocity of the shear wave ($V_S$) of the denser of the two materials (the upper and lower half-spaces).

In 1978 Yamanouchi et al, considered piezoelectric boundary acoustic waves (PBAWs) propagating at the interface between 127°YX LT and $SiO_2$. The polarization of the PBAW considered by Yamanouchi was proportionately longitudinal. The second largest displacement is the Shear Vertical (SV) type, and the SH is the smallest. FIG. 5 illustrates the polarization of this wave. Yamanouchi's wave is a quasi-longitudinal type.

Reference is made to K. Yamanouchi, K. Iwahashi and K. Shibayama, "Piezoelectric acoustic boundary waves propagating along the interface between SiO2 and LiTaO3," IEEE Trans. Sonics and Ultrasonics, vol. su-25, No. 6, 1978, pp. 384-389, the disclosure of which is herein incorporated by reference.

The wave described by Yamanouchi remains sensitive to the upper and lower half-space properties. Hashimoto et al have published the sensitive conditions for which a PBAW may exist.

Reference is made to K. Hashimoto, Y. Wang, T. Omori, M. Yamaguchi, M. Kadota, H. Dando, and T. Shibahara, "Piezoelectric Boundary Acoustic Waves: Their Underlying Physics and Applications," IEEE Ultrasonics Symposium Proceedings, 2008, the disclosure of which is herein incorporated by reference.

In 1983, Shimizu overcame the delicate existence of the boundary acoustic wave by introducing a film of slow velocity at the interface between the two half-spaces, FIG. 6.

Reference is made to Y. Shimizu and T. Irino, "Stoneley waves propagating along an interface between piezoelectric material and isotropic material," in Proc. IEEE Ultrasonic Symp., 1983, pp. 373-376, the disclosure of which is herein incorporated by reference. In this reference, Shimizu studies Stoneley waves for an isotropic material like glass and a piezoelectric substrate ZnO. FIG. 6 illustrates Nickel, Gold and Aluminum layers.

The field distribution includes contributions of all three displacements, FIG. 6. For Shimuzu's wave, the polarization is proportionately shear horizontal. A simple illustration of a Shimuzu's boundary acoustic wave propagating in the direction of the $X_1$-axis and decaying in along the $X_3$-axis is illustrated in FIG. 7.

Successful application of SAW filters and duplexers in cellular handsets produced intense competition in the development of high performance with small sizes. In 2006 Murata introduced PBAW based commercial products for the cellular handset market.

Reference is made to H. Kando, D. Yamamoto, M. Mimura, T. Oda, A. Shimizu, K. Shimoda, E. Takata, T. Fuyutsume, R. Kudo and M. Kadota, "RF filter using boundary acoustic wave," in Proc. IEEE Ultrasonic. Symp., 2006, pp. 188-191, the disclosure of which is herein incorporated by reference.

The physical embodiment of the devices introduced by Murata is illustrated in FIG. 9. The Murata device is conceptually similar to the device by Shimizu. However, the device by Kando et al replaced the layer of Gold at the interface of the half-spaces with a copper IDT. These devices by Murata exhibit strong piezoelectric coupling, lower temperature coefficient of frequency, and eliminate the requirement for a hermetic air cavity package which is a standard requirement for conventional SAW filters. However, these devices require precise manufacturing processes and suffer from larger variations in frequency than do conventional SAW devices.

Reference is now made to K. Yamanouchi and Y. Sato, "Piezoelectric acoustic boundary waves in the structure of multilayer thin films/electrode/piezoelectric substrates," Journal of Applied Physics, 103, 114105, 2008 and to Y. Sato, D. Malocha and K. Yamanouchi, "Piezoelectric boundary waves in the structure of AlN/SiO2/Electrode/ZnO, AlN/Si substrate," in Proc. Joint Japan-USA international meeting on acoustic wave devices, 2008, pp. 91-94, the disclosures of which is herein incorporated by reference.

Yamanouchi and Sato recognized the practical advantages of employing a finite $SiO_2$ thickness in combination with an upper half-space of AlN or $Al_2O_3$. For example, SAW devices are not constructed on actual half-space dielectrics. Rather, the dielectric needs to be sufficiently thick such that it may be approximated as effectively infinite in thickness. The thickness required for a $SiO_2$ layer to appear effectively infinite is rather extreme and impedes the efficient high volume manufacturing of such devices. By restricting the $SiO_2$ thickness and depositing an AlN or $Al_2O_3$ film over the $SiO_2$, Yamanouchi and Sato were able to significantly reduce the thickness of the upper dielectrics to a thickness more attractive for high volume manufacturing.

The physical principle dictating the required thickness of the $SiO_2$, or AlN, or $Al_2O_3$ is the penetration depth of the acoustic energy into the layer.

FIG. 10 illustrates the penetration of the boundary wave's acoustic energy in an upper half-space of $SiO_2$, for a device composed of YXLN/Cu-Electrode/$SiO_2$. FIG. 12 Illustrates the penetration of the boundary wave's acoustic energy in an upper half-space of AlN over a $SiO_2$ layer, for a device composed of YXLN/Cu-Electrode/$SiO_2$/AlN.

The decay of the acoustic energy penetrating into the upper half-space is related to the shear wave velocity in the upper half-space. The greater the velocity the more rapid the acoustic energy decays.

Another advantage of using a high velocity material for the upper region of practical PBAW devices is that as the upper dielectric layer decreases in thickness the number of acoustic plate modes is reduced. This effect can be seen in the published work on Y. Wang et al, FIG. 11.

Reference is made to Y. Wang, K. Hashimoto, T. Omori, and M. Yamaguchi, "Analysis of Excitation and Propagation of Piezoelectric Boundary Acoustic Waves in Overlay/Metal Grating/Rotated YX-LiNbO$_3$ Structure," 2008 Joint Japan-USA International Meeting on Acoustic Wave Devices, pp. 53-58, the disclosure of which is herein incorporated by reference.

However, there remains one substantial impediment to the high volume manufacturing of PBAW type RF filters and duplexers. That is the devices sensitivity to process variation. Since the acoustic energy at the surface of the upper dielectric layer ($SiO_2$, AlN, $Al_2O_3$, etc) is negligible, there is no practical process by which the upper surface may be treated in order to adjust the devices center frequency.

There remains a need for PBAW devices that permit a frequency of operation to be adjusted as desired.

SUMMARY OF THE INVENTION

Embodiments of the present invention preserve advantages of boundary acoustic wave devices, and in particular preserve a low TCF and lack of a hermetic package requirement, while permitting an efficient and effective method to adjust a device frequency of operation. To this end, a solid dielectric body above interdigitated SAW devices is, at least partially, replaced with a slotted dielectric body. The slots in the dielectric body permit for the deposition or removal of material from the region in close proximity to the device's electrodes. The addition or removal of material in this area will result in a change to the devices' frequency of operation. Typically, a depth dimension of each of the slots in the dielectric body may be at least equal to a width dimension of each of the electrodes.

The invention may be embodied in an acoustic wave device comprising a piezoelectric substrate, a plurality of electrodes formed on a surface of the piezoelectric substrate, a first dielectric overcoat extending at least between each some of the plurality of electrodes, and a second dielectric overcoat extending over the first dielectric overcoat, the second dielectric overcoat having a plurality of slots, wherein the slots are located above the plurality of the electrodes. Typically, a depth dimension of each of the plurality of slots in the second dielectric overcoat is at least equal to a width dimension of each of the plurality of electrodes. Further, each of the plurality of electrodes comprises a density greater than a density of each of the first and second overcoats. The first and second dielectric overcoats may be formed from a similar material. The slots may extend directly above each of the plurality of electrodes, thus each electrode having a slot thereabove within the second overcoat.

In one embodiment, the first dielectric overcoat may comprise $SiO_x$. The plurality of electrodes may further comprise a resonator structure.

For embodiments of the invention, the first dielectric overcoat may comprise a thickness above each electrode ranging from 0 p to 0.75 p. The first dielectric overcoat may comprise a positive TCF.

The second dielectric overcoat may comprise at least one of AlN, $SiO_x$ and $Al_2O_3$. The substrate comprises at least one of lithium tantalate and lithium niobate. The substrate may comprise a piezoelectric crystal.

A low impedance material may be carried above the second dielectric overcoat. The low impedance material may comprise an epoxy.

In keeping with the teachings of the invention, one embodiment of a surface acoustic wave device may comprise a piezoelectric substrate, an electrode pattern provided on a surface of the piezoelectric substrate, wherein the electrode pattern forms a resonator, a first dielectric overcoat with significant SiOx content, the dielectric overcoat having a positive TCF, the first dielectric overcoat disposed between and over electrodes of the electrode pattern, wherein the first dielectric overcoat has thickness over the electrode pattern in a range between 0.00 p and 0.75 p, and a second dielectric overcoat extending above the first dielectric overcoat, the second dielectric overcoat having slots therein, wherein the slots extend directly above the electrodes.

The SiOx as herein described refers to a dielectric comprised of silicon and oxygen, wherein "x" is nominally an integer and may vary provided a positive TCF is preserved.

Yet further, embodiments according to the teachings of the present invention may include an acoustic wave device comprising a piezoelectric substrate, a plurality of electrodes formed on a surface of the piezoelectric substrate, and a dielectric overcoat extending at least between and above some of the plurality of electrodes, wherein a plurality of slots are located directly above the plurality of the electrodes, and wherein a depth dimension of each of the plurality of slots is at least equal to a width dimension of each of the plurality of electrodes.

BRIEF DESCRIPTION OF THE DRAWINGS

For a fuller understanding of the invention, reference is made to the following detailed description, taken in connection with the accompanying drawings illustrating various embodiments of the present invention, in which;

FIG. 14 is a partial diagrammatical illustration of one embodiment of a slotted boundary wave device according to the teachings of the present invention taken through lines 14-14 of FIG. 14a;

FIGS. 29a and 29b illustrate a TCV as a function of dielectric thicknesses for YX-LN and YX-LT substrates, by way of example;

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

To overcome the difficulty in manufacturing PBAW devices with a specified frequency of operation, a method for adjusting the frequency after the device has been fabricated is desired. Unfortunately, the acoustic energy is bound internal to the material. As a result an external treatment of the device will not have a significant impact on the device's operating frequency. To meet the stringent manufacturing specifications, the frequency of such a device must be adjusted prior to the deposition of the dielectric overcoat. The drawback is then that the device cannot be adjusted for the variations of the physical properties of dielectric material. To overcome this difficulty the physical embodiment of the device must be modified to permit access to the region of the material where the acoustic modes are bound.

Figure 1:
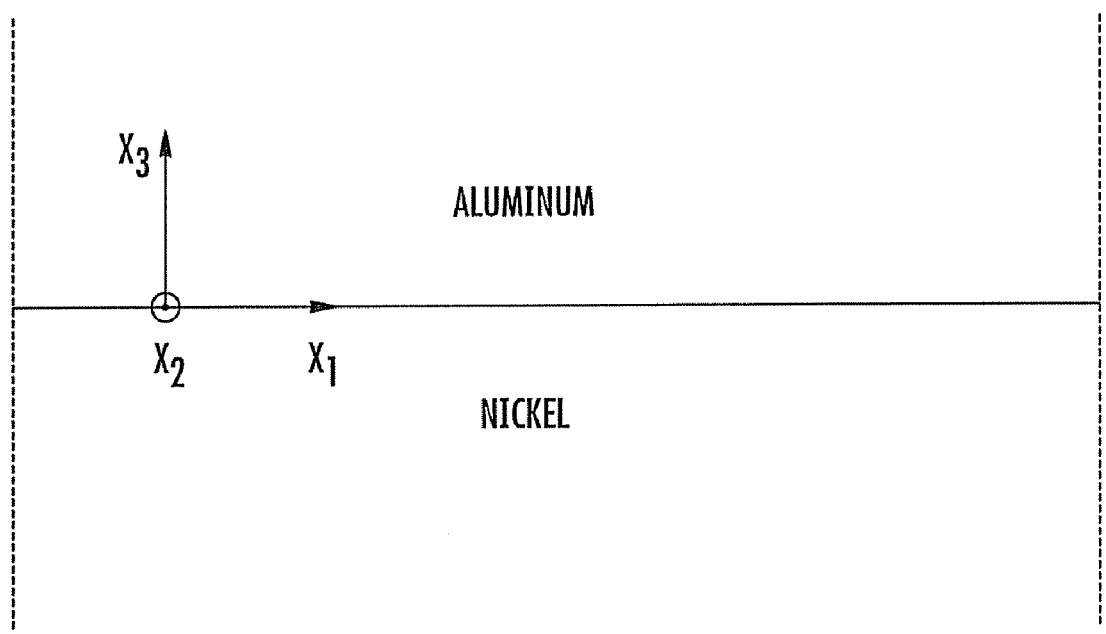
FIG. 1 is a diagrammatical illustration of one embodiment of a boundary in a boundary wave device supporting a Stoneley wave.
Figure 2:
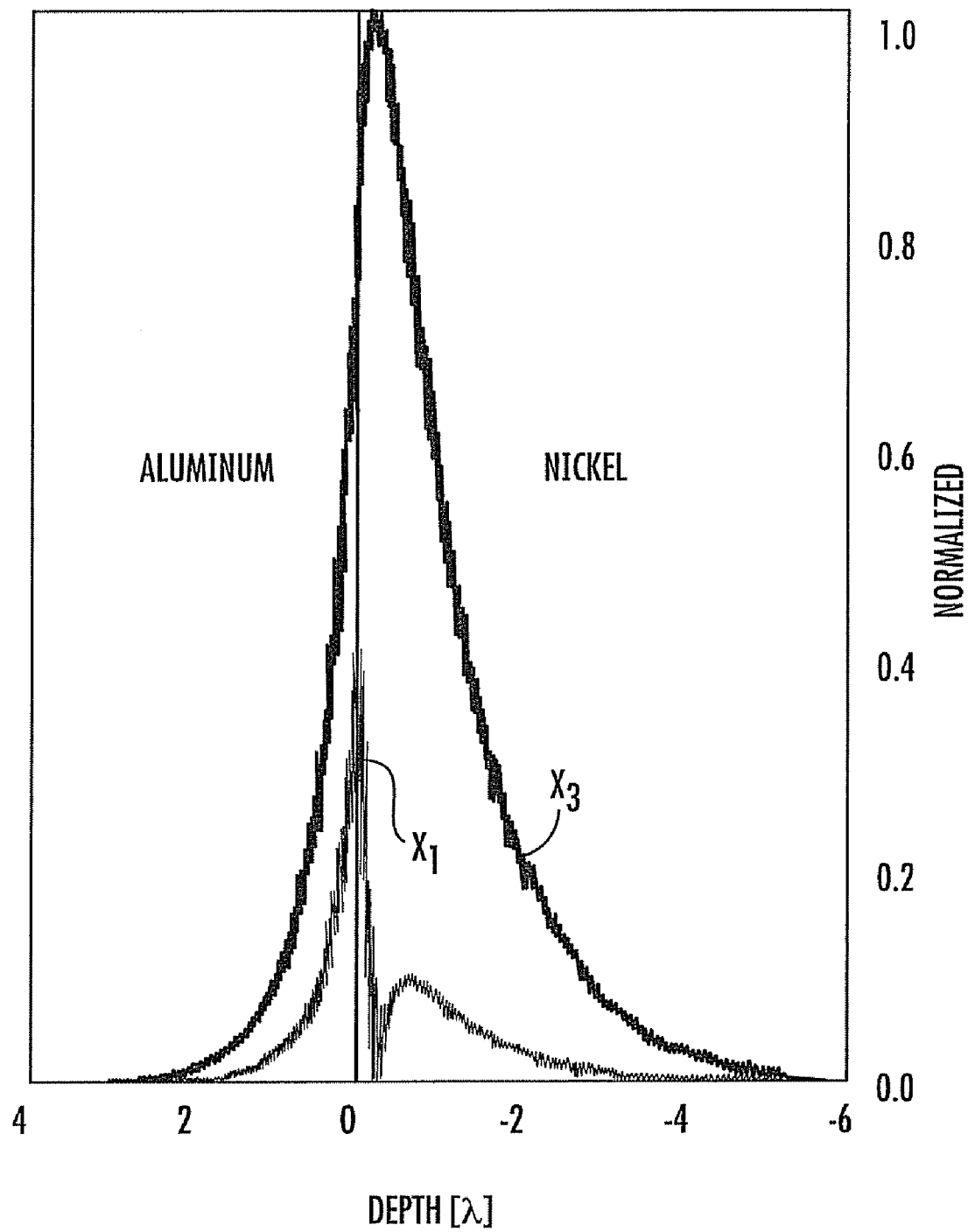
FIG. 2 illustrates polarization of a Stoneley wave at an Al/Ni interface illustrated in FIG. 1.
Figure 3:
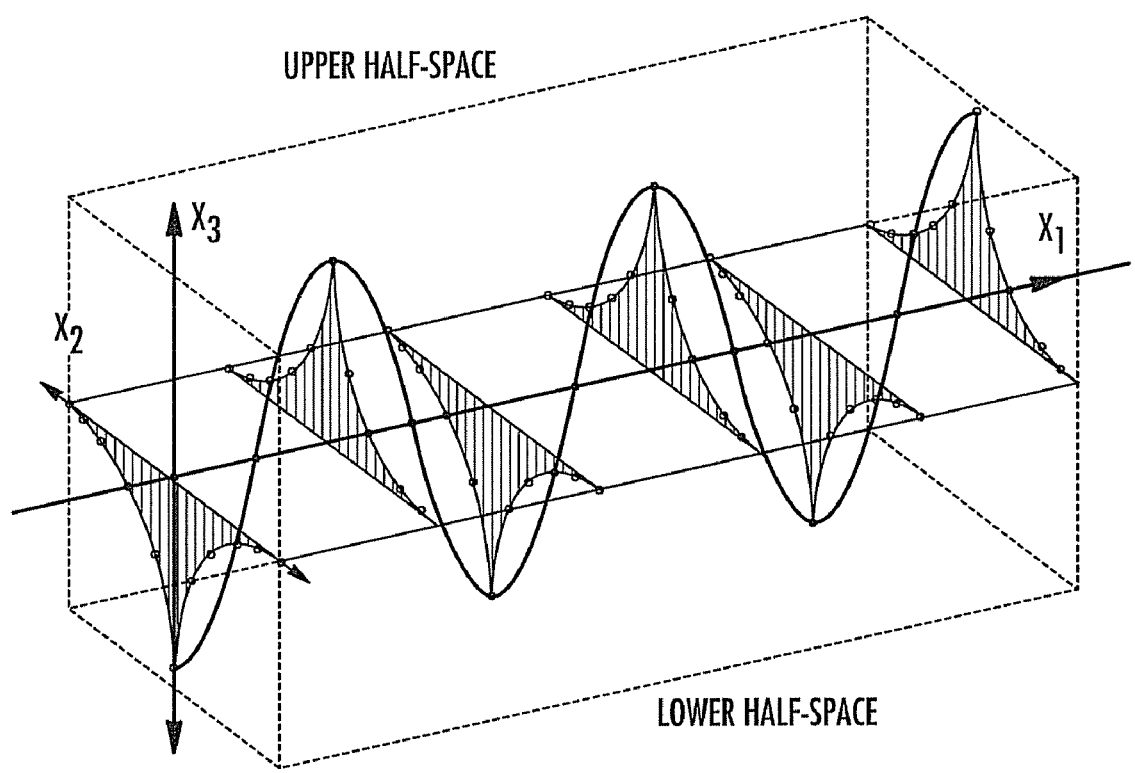
FIG. 3 illustrates a Stoneley wave propagating in the direction of the $X_1$ axis of FIG. 1.
Figure 4:
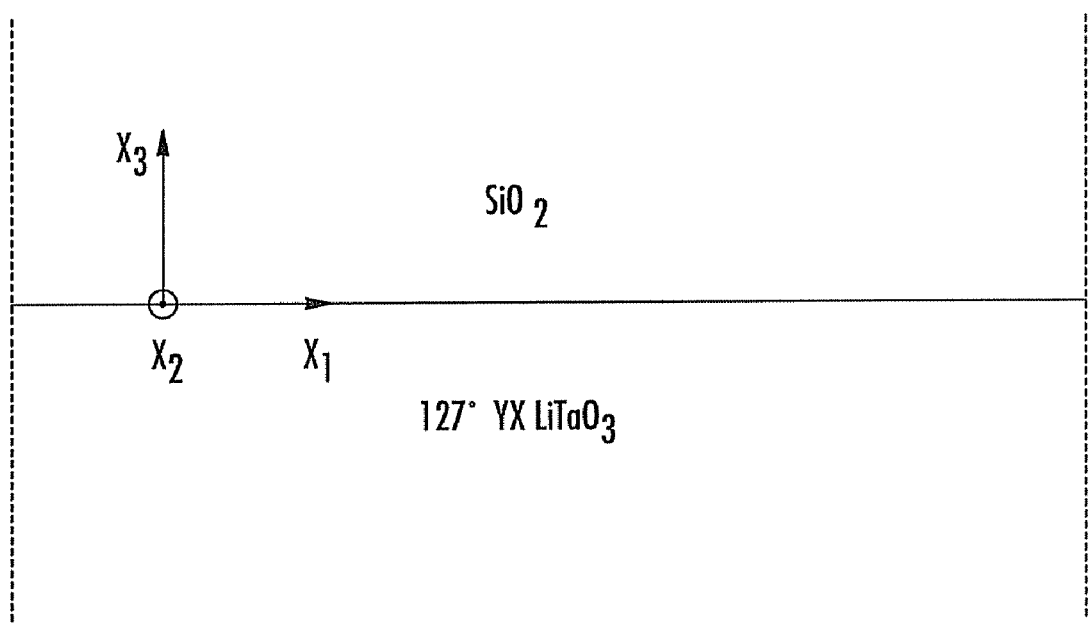
FIG. 4 is a diagrammatical illustration of one embodiment of a boundary in a boundary wave device such as that described as a Yamanouchi's quasi-longitudinal PBAW.
Figure 5:
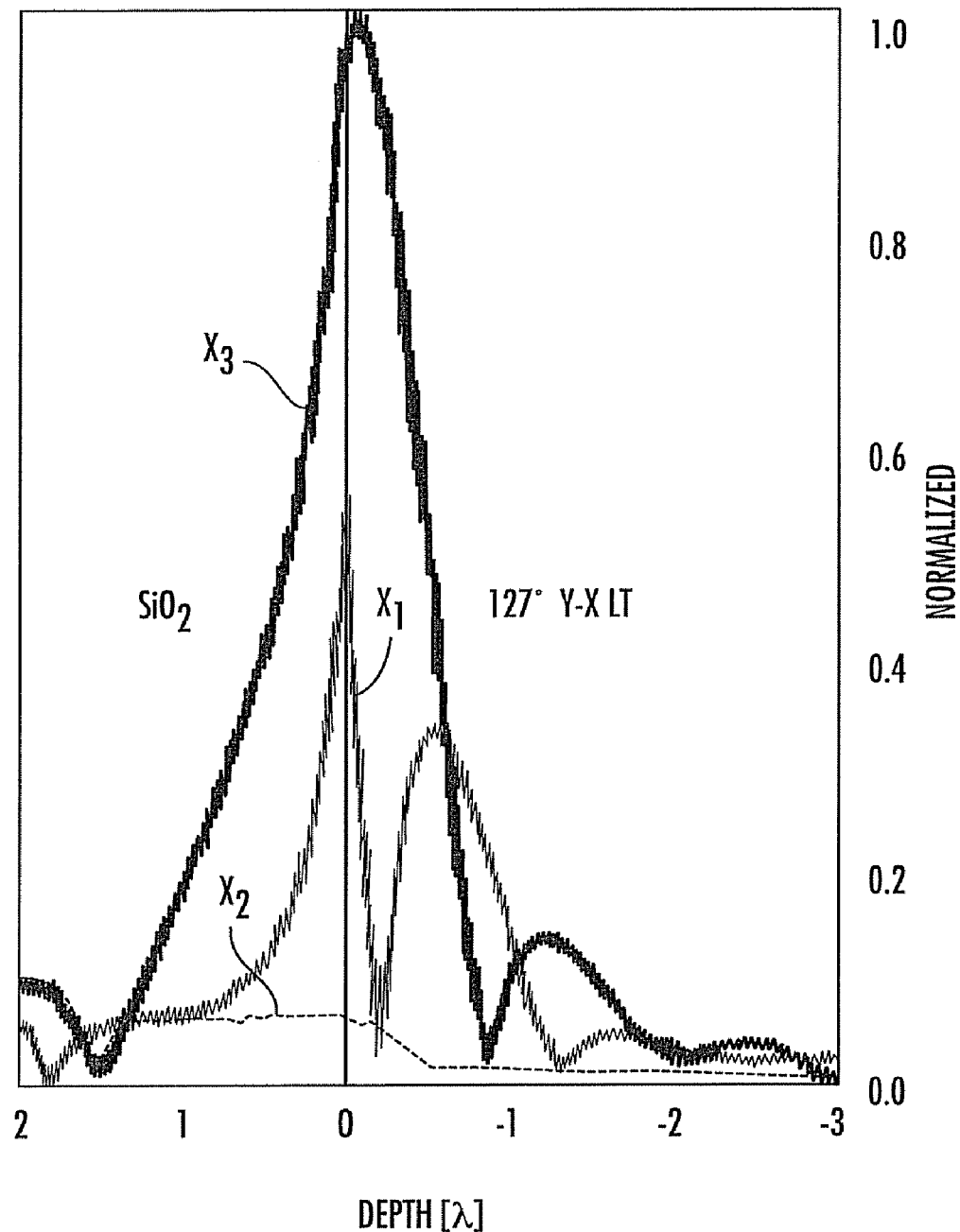
FIG. 5 illustrates polarization of the quasi-longitudinal PBAW at the interface of $SiO_2/127°$ $YXLiTaO_3$ of FIG. 4.
Figure 6:
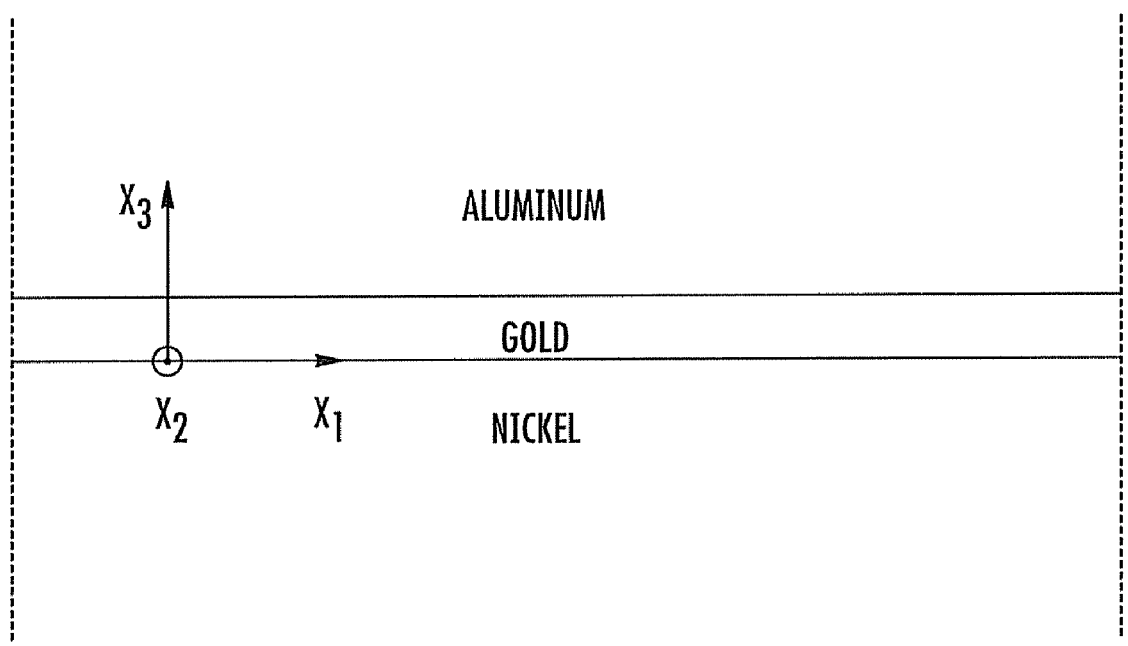
FIG. 6 is a diagrammatical illustration of a boundary in one embodiment of Shimuzu's Al/Au/Ni structure supporting quasi-SH type boundary waves.
Figure 7:
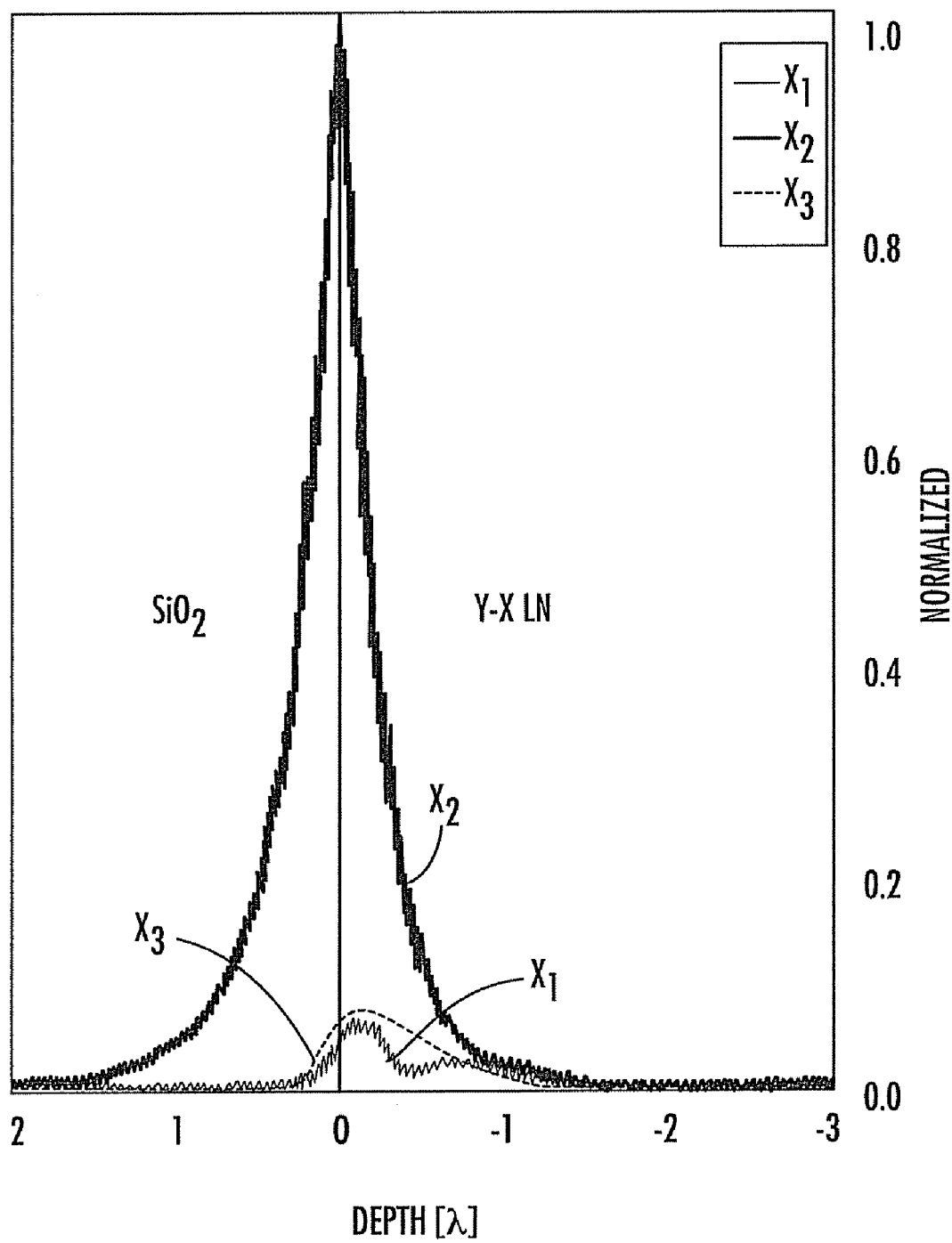
FIG. 7 illustrates polarization of Shimusu's quasi-SH type boundary wave for the structure of FIG. 6.
Figure 8:
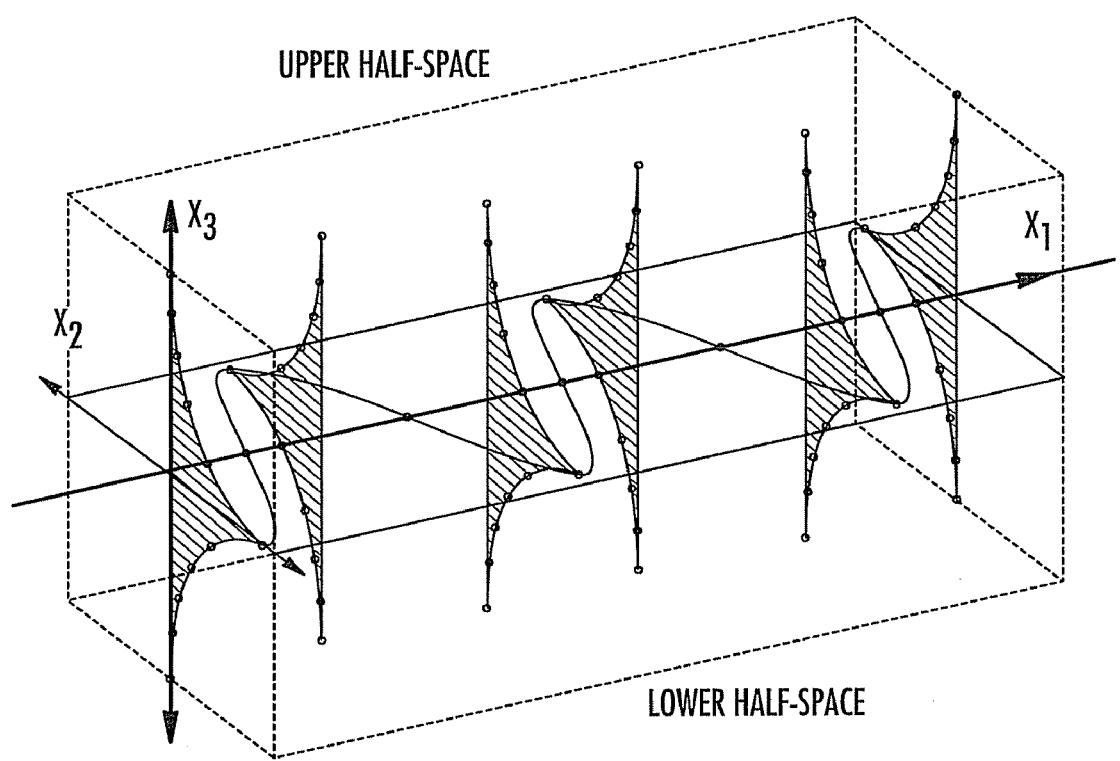
FIG. 8 illustrates a Shimuzu's wave propagating in the direction of the $X_1$ axis for the structure of FIG. 6.
Figure 9:
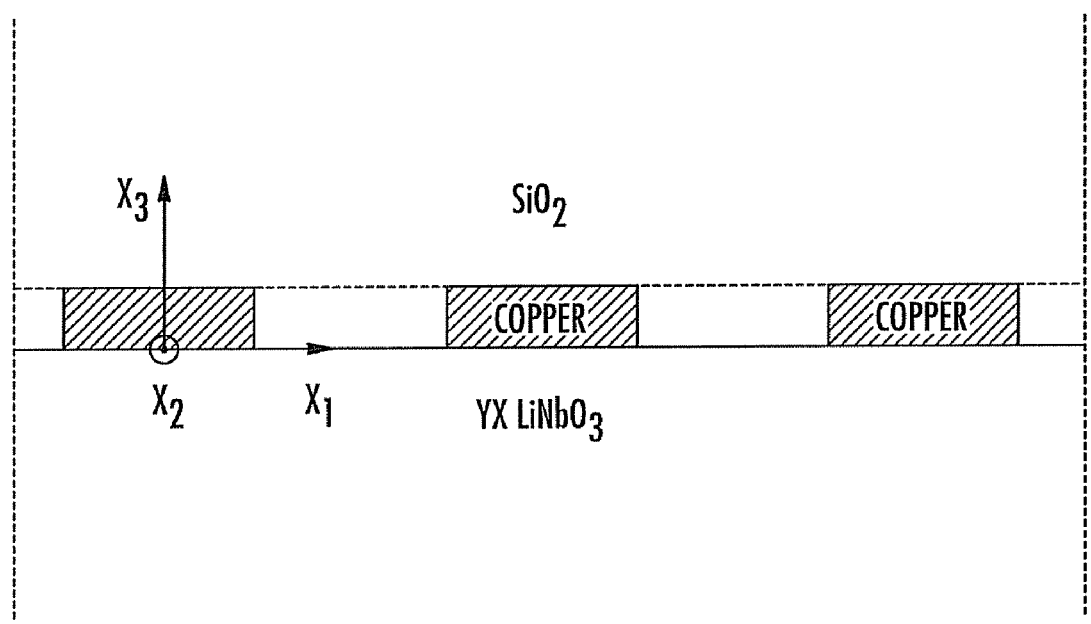
FIG. 9 is a diagrammatical illustration of an embodiment of Kando's PBAW structure using a low velocity metal grating/IDT.
Figure 10:
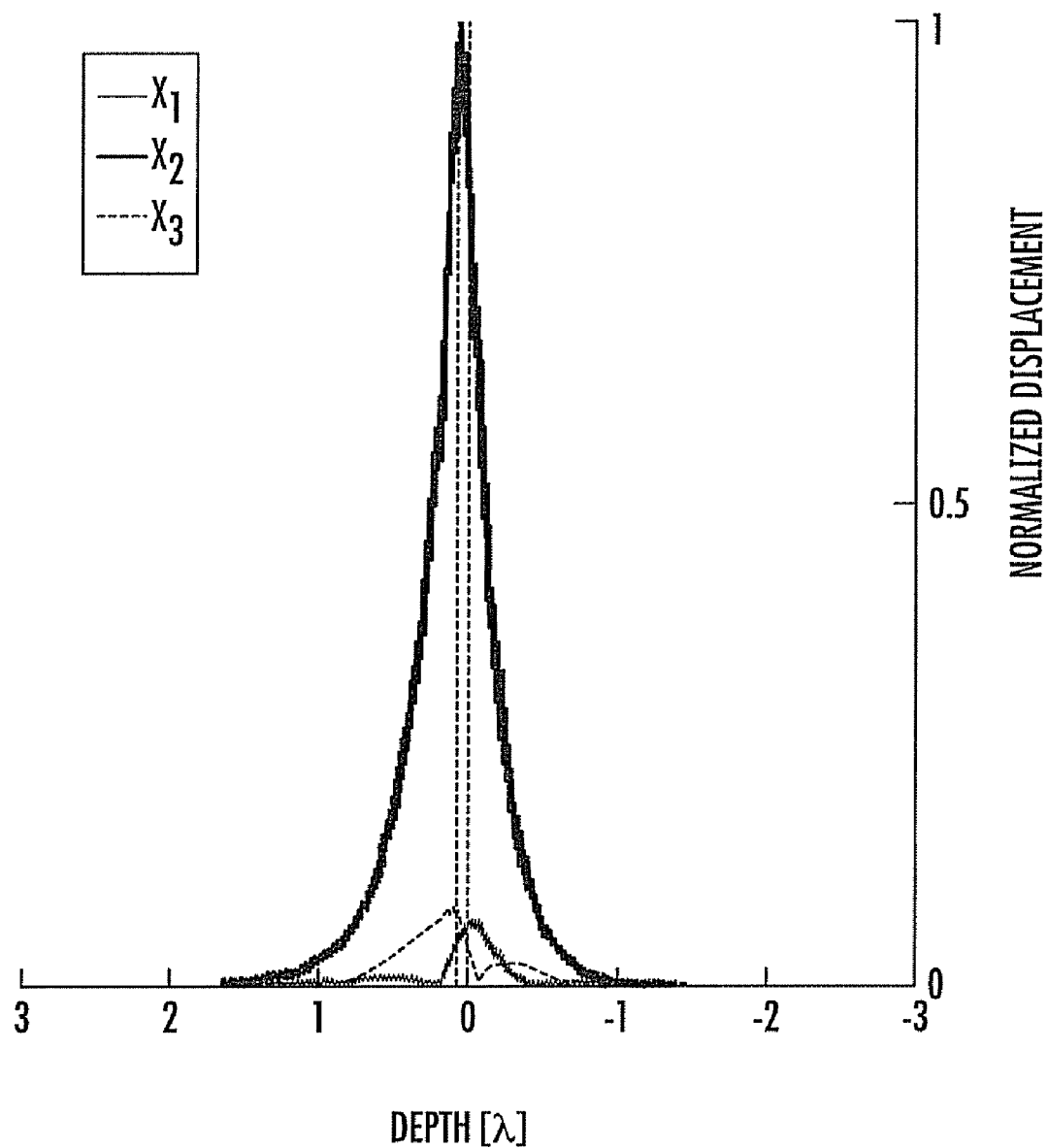
FIG. 10 illustrates polarization of the quasi-SH PBAW at the interface of $SiO_2$/Cu-electrode/$YXLiNbO_3$ for the structure of FIG. 7.
Figure 11:
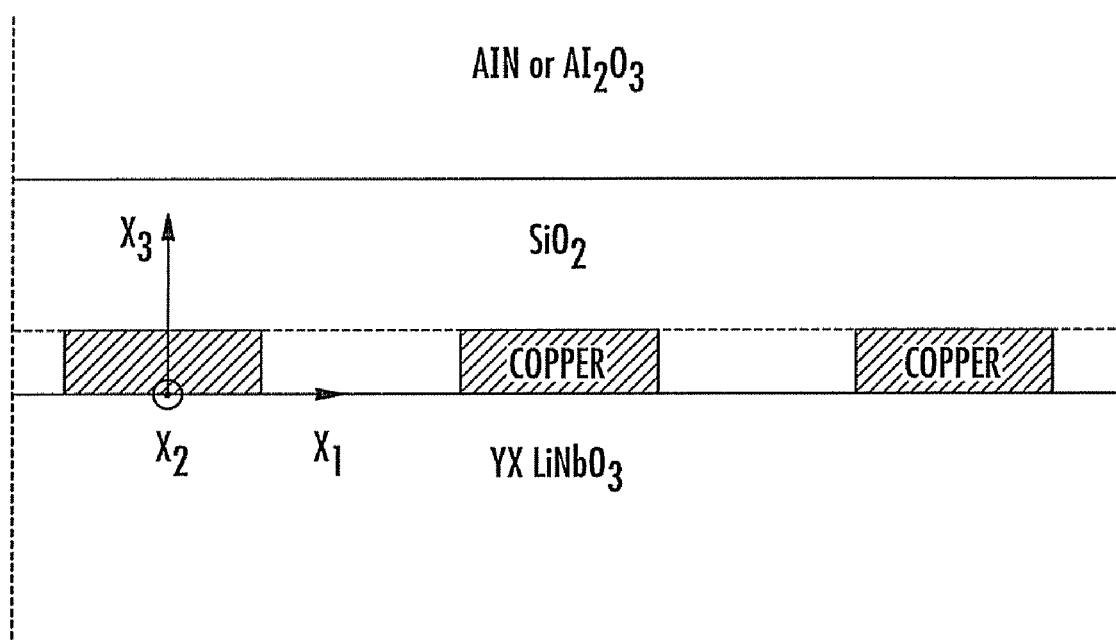
FIG. 11 is a diagrammatical illustration of an embodiment a PBAW structure using a low velocity metal grating/IDT with a high velocity overcoat (AlN or $Al_2O_3$)
Figure 12:
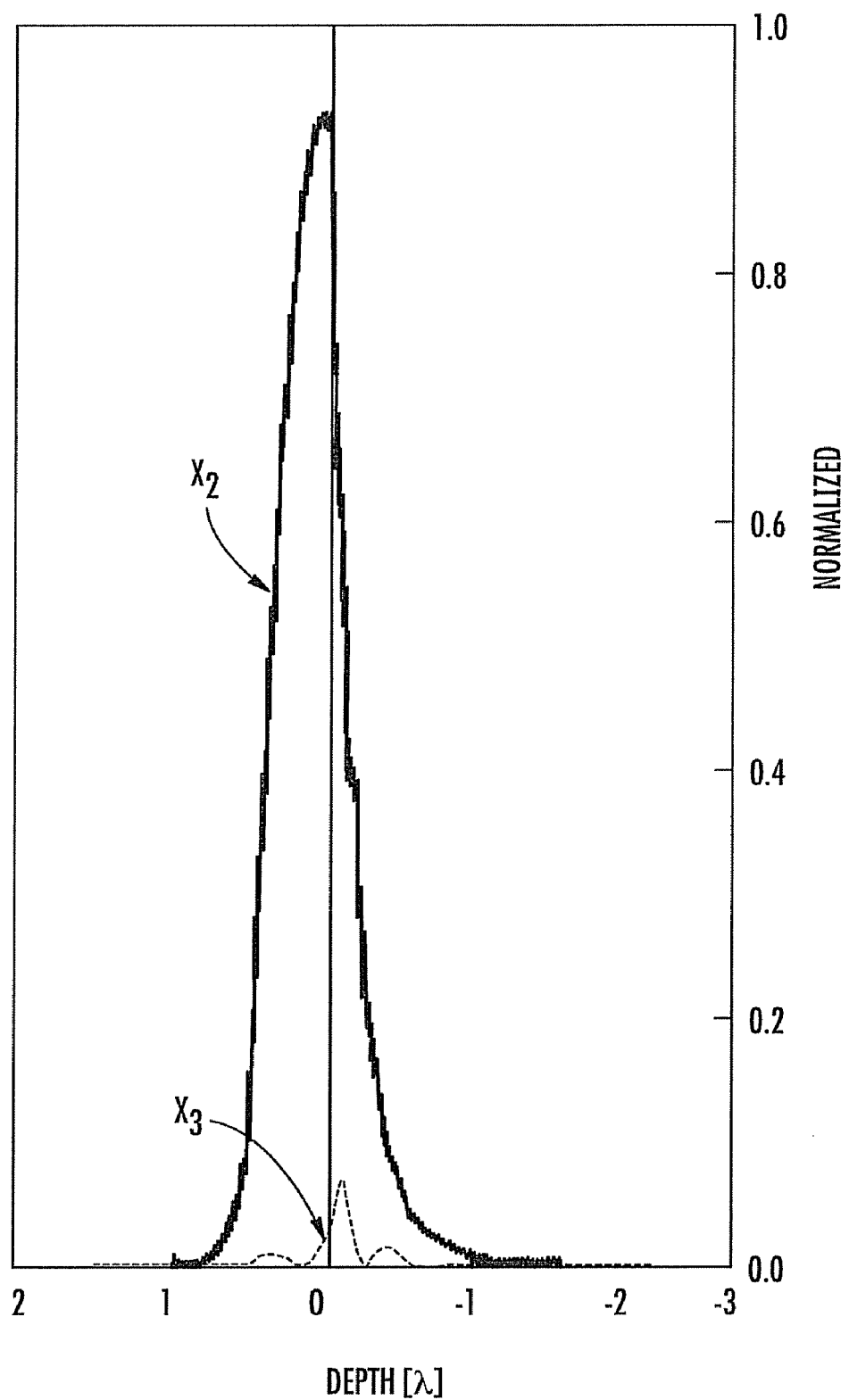
FIG. 12 illustrates polarization of a proportionately shear horizontal PBAW at the interface of $AlN/SiO_2$/Cu-electrode/$YXLiNbO_3$ for the structure of FIG. 11.
Figure 13:
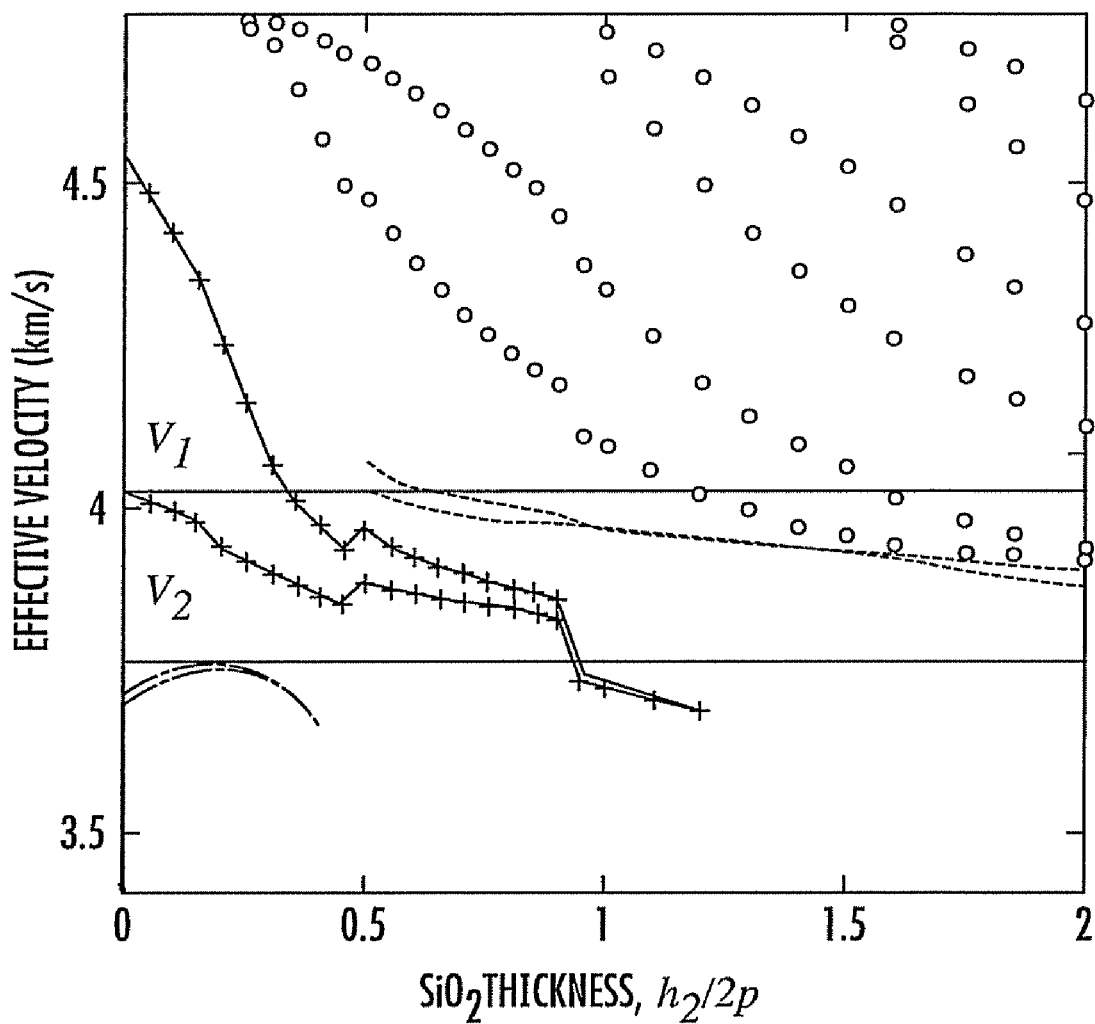
FIG. 13 is a plot illustrating a dependence of acoustic mode velocity as a function of upper region thickness for $SiO_2$/YXLN, wherein plate modes are indicated by symbols in the shape of a circle.
Figure 14:
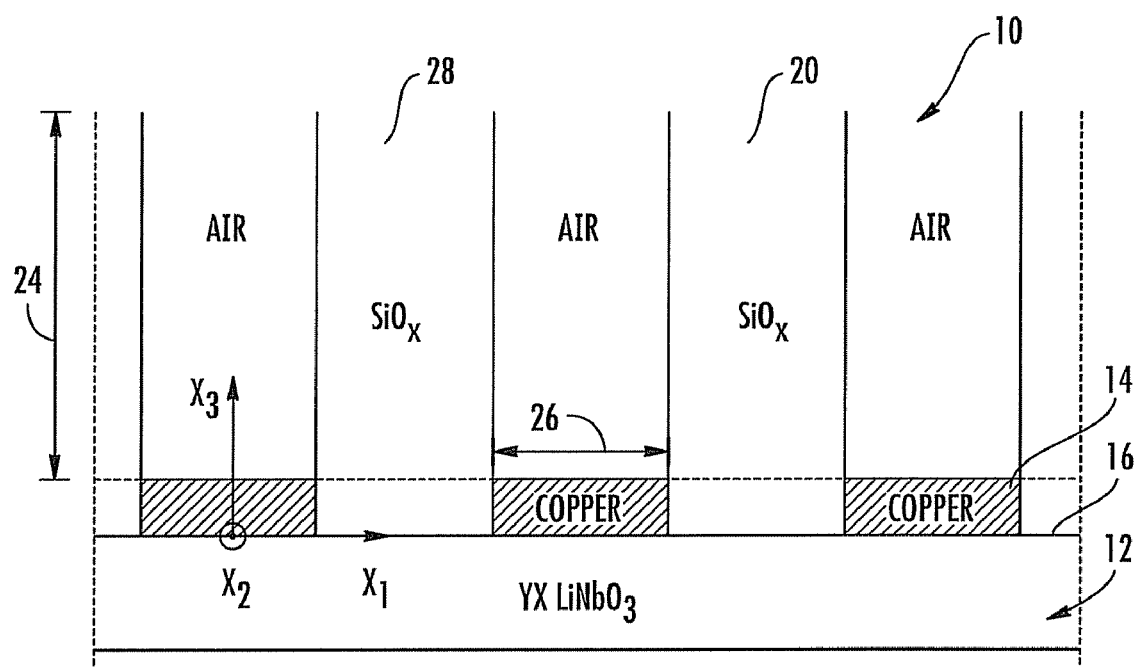
Figure 14A:
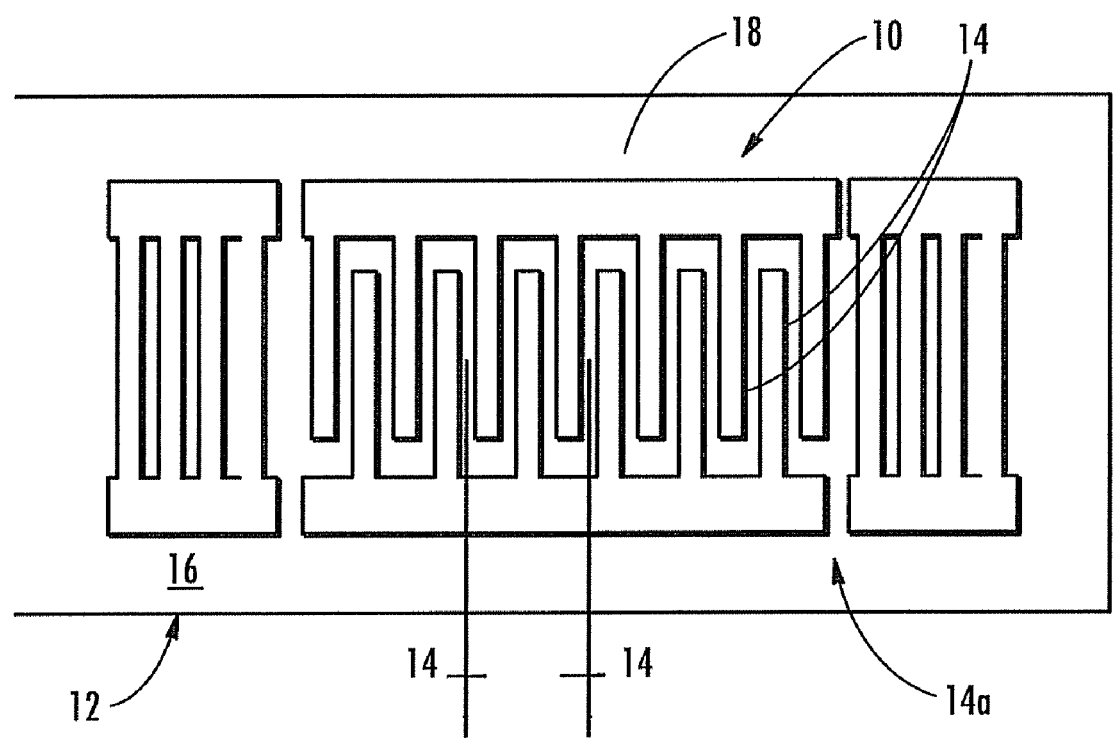
FIG. 14a is a diagrammatical top plan view illustration of a resonator filter illustrating elements of the invention.

With reference now to FIGS. 14 and 14a, by way of example, one embodiment of a slotted boundary wave device 10 according to the teachings of the present invention may be described as comprising a piezoelectric substrate 12 with a plurality of electrodes 14 formed on a surface 16 of the piezoelectric substrate, the plurality of electrodes including an interdigital transducer (IDT) 18. As illustrated with continued reference to FIG. 14, a dielectric overcoat 20 extends between and above the plurality of electrodes 14. Further, slots 22 are located above the electrodes 14, wherein a depth dimension 24 of each of the slots 22 is at least equal to a width dimension 26 of each of the electrodes 14. The slots 22 within the dielectric overcoat 20 may be considered as forming a series of pillars 28 of dielectric material and slots 22.

By introducing slots 22 into the upper portion 20a of the dielectric overcoat 20, access to a region bounding the acoustic energy is achieved. With these slots 22, it is possible to use processes to add or remove material from the bottom 22a of the slots 22 in order to adjust an operating frequency of the device 10.

As illustrated with reference again to FIG. 14a, the plurality of electrodes 14 may comprise a resonator structure 14a.

With continued reference to FIG. 14, the dielectric pillars 28 are capable of propagating acoustic energy vertically away from the electrodes 14. This energy propagates in the form of acoustic modes guided within the pillars.

Figure 15:
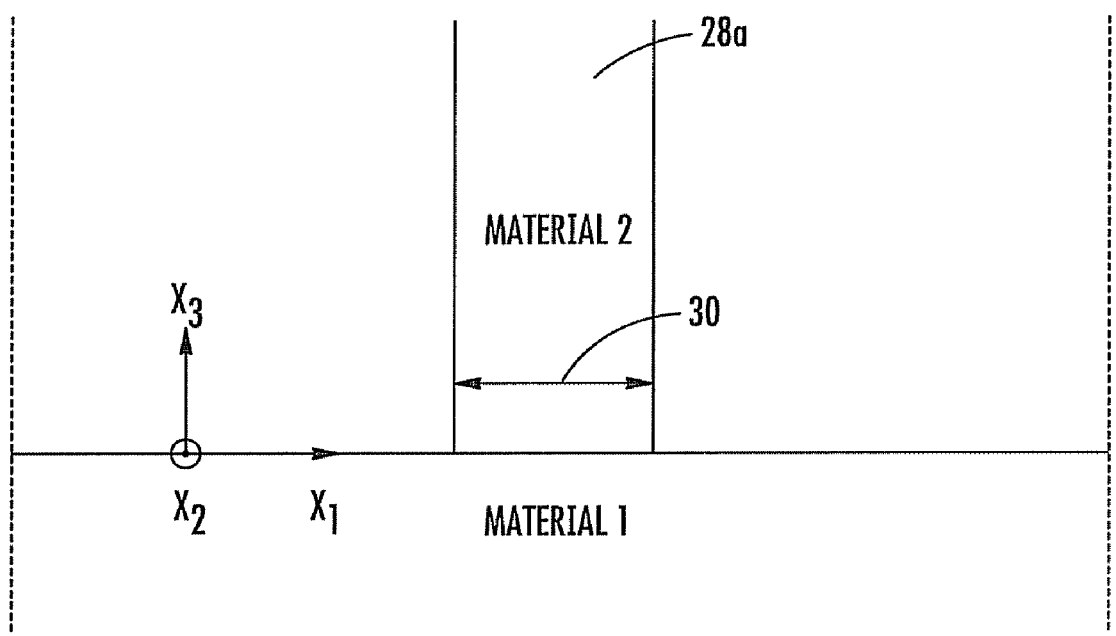
FIG. 15 is a diagrammatical illustration of an isolated dielectric pillar (material 2) attached to a planar half-space (material 1)

By way of example, consider the isolated pillar 28a in FIG. 15. This structure will support SH-type modes propagating along the $X_3$ direction. The wave number of the guided modes along the vertical coordinate, $\beta_3$, may be expressed as a function of the wave number along the coordinate of desired propagation of the bounded energy, $\beta_1$. Eqn (1) describes the dispersion relationship for SH type modes.

$$\beta_1 = \sqrt{\frac{\rho\omega^2}{c_{44}} - \beta_3^2} = \frac{n\pi}{w_P} \qquad \text{eqn. (1)}$$

In eqn (1), the density of the pillar's material is $\rho$, the shear elastic constant is $c_{44}$, the width of the pillar is $w_P$ and the order of the mode is n.

Figure 16:
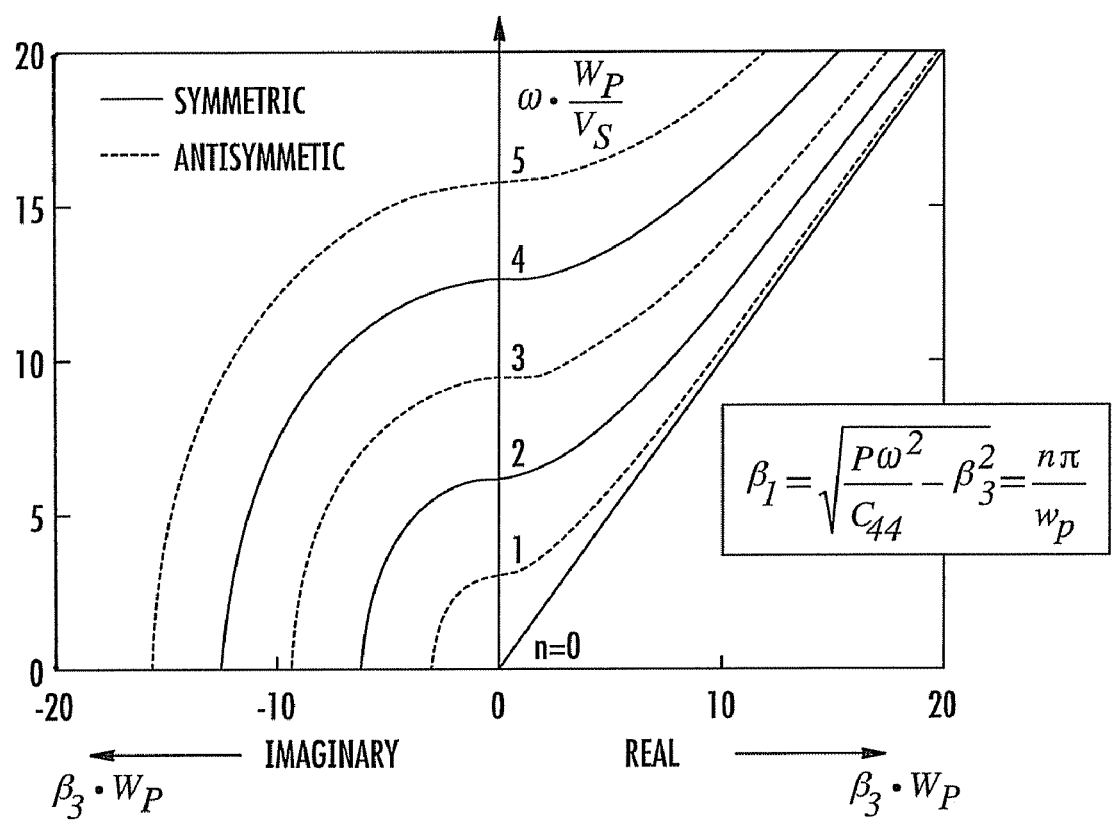
FIG. 16 illustrates a dispersion of the first 6 modes which may propagate energy along the pillars' lengths.
Figure 17:
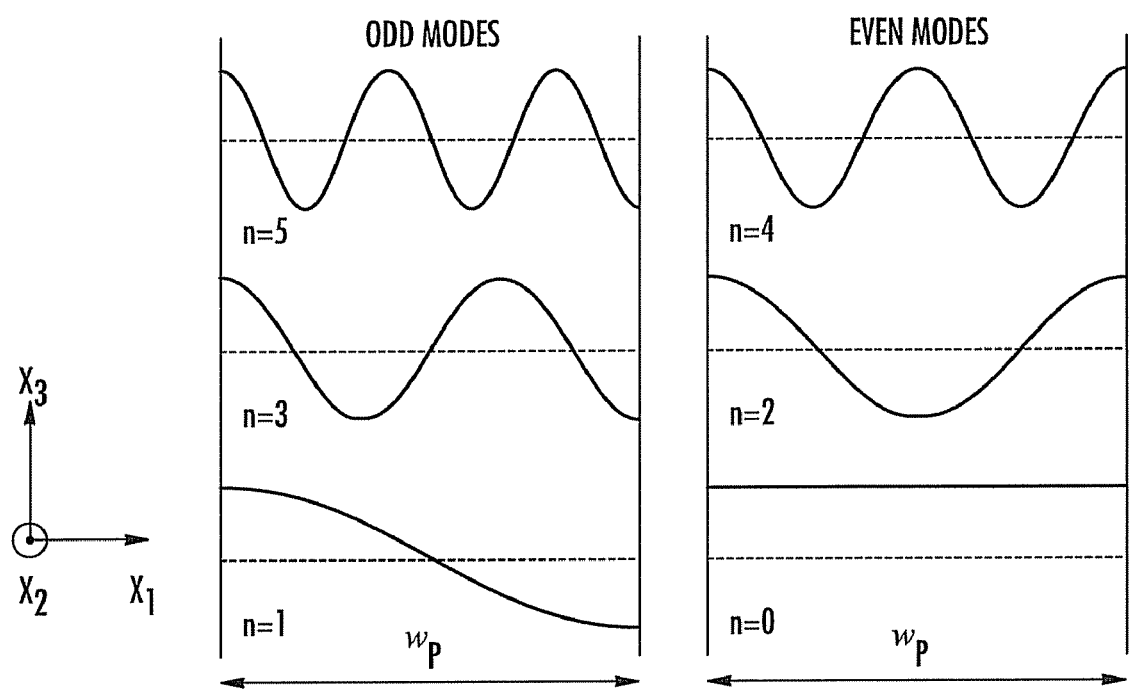
FIG. 17 illustrates a dependence of the first 6 modes across the width of the pillars.

FIG. 16 illustrates the dispersion diagram for the first 6 modes guided by such a pillar 28a. FIG. 17 illustrates the spatial dependence of these first 6 modes along the cross section of the pillar 28a.

The width 30 of the pillar 28a is approximately equal to the electrode's width 26, or is approximately equal to half of the electrode's period. By way of example, this implies that the resonant frequency of the PBAW device 10, $f_R$, is approximately half that of the frequency of the pillar's first order mode, n=1.

$$2\pi \cdot f_R \frac{w_P}{V_S} \approx \frac{\pi}{2} \qquad \text{eqn. (2)}$$

As a result, the first and higher order modes are evanescent and only the lowest order mode, n=0, may couple to the structure.

Two methods may be applied to suppress the coupling to zeroeth order pillar mode, including (1) the pillar's structure may be modified to present a large acoustic mismatch between the base of the pillar and the material below, and (2) the physical embodiment of the structure below the pillar is such to ensure the acoustic field at the base of the material is orthogonal to the zeroeth order mode. This implies that the integral of the acoustic field along the base of the pillar is approximately zero.

Figure 18:
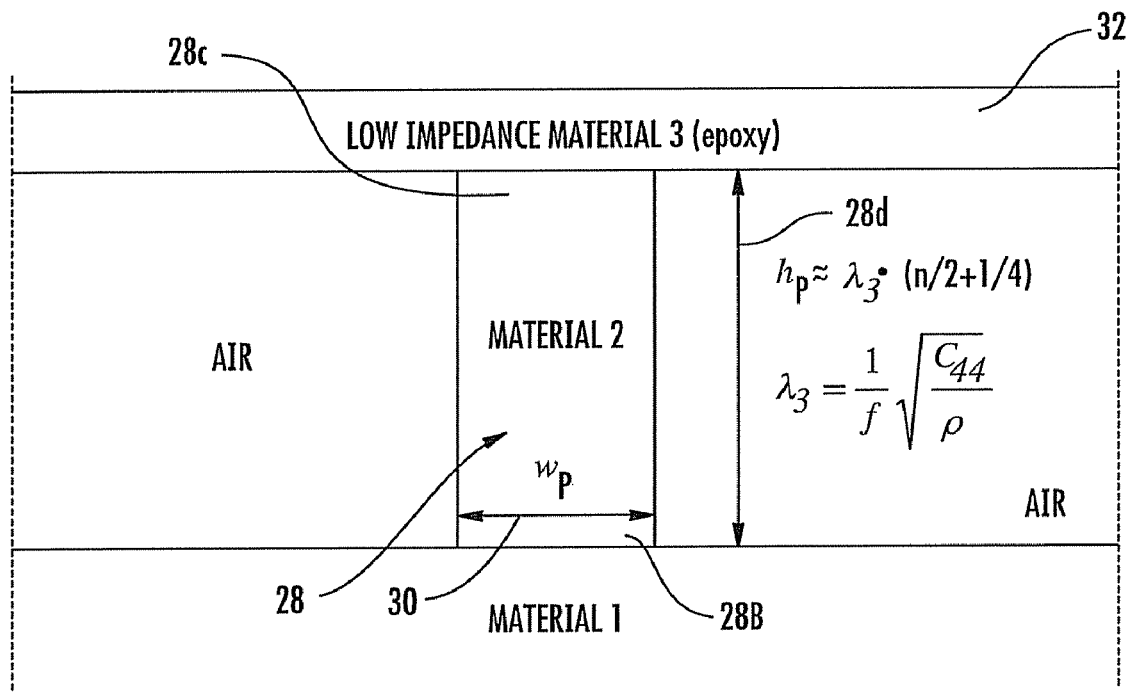
FIG. 18 is a diagrammatical illustration of an isolated pillar, approximately a quarter of a wavelength in length, and terminated in a low acoustic impedance.

FIG. 18 illustrates one manner to introduce a large acoustic mismatch at the base 28b of the pillar 28. In FIG. 18, a low impedance material 32 (such as an epoxy) is laminated across the top 28c of the pillar 28. By controlling the height 28d of the pillar 28 to be approximately equal to multiples of ¼ or ¾ of the wavelength, of the zeroeth order pillar mode, the low impedance presented at the top 28c of the pillar is transformed to a high impedance at the base 28b of the pillar. A similar result is obtained without adding epoxy by choosing the height of the pillar.

Figure 19:
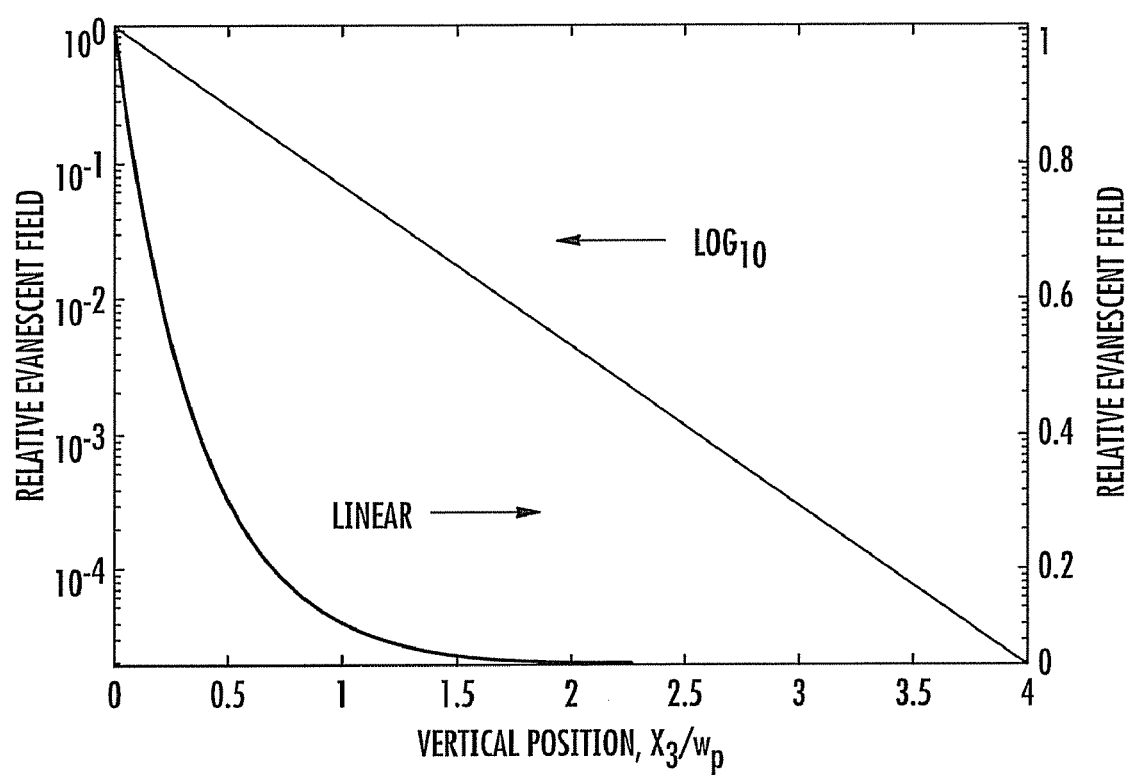
FIG. 19 illustrates a relationship between evanescent amplitude of the first order pillar mode as a function of position alone the pillar's height.

If an epoxy is present at the top 28c of the pillar 28, the first order pillar mode's evanescent field may be attenuated by the acoustic losses in the epoxy. FIG. 19 illustrates the estimate of the first order mode's evanescent field along the length of the pillar. FIG. 19 indicates that the evanescent field decays very rapidly and that a pillar height 28d of greater than a few pillar widths 30 is sufficient to suppress the evanescent losses to negligible level.

Figure 20:
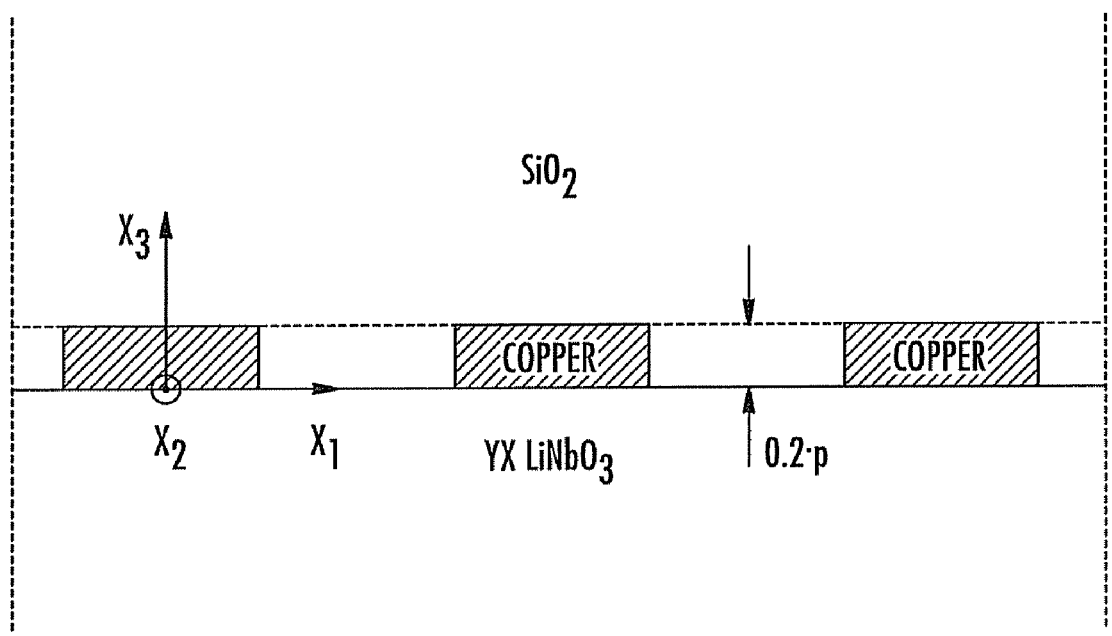
FIG. 20 is a diagrammatical illustration of one embodiment of a PBAW device for $SiO_2$-Slots/Cu-Electrode/YXLN.
Figure 21:
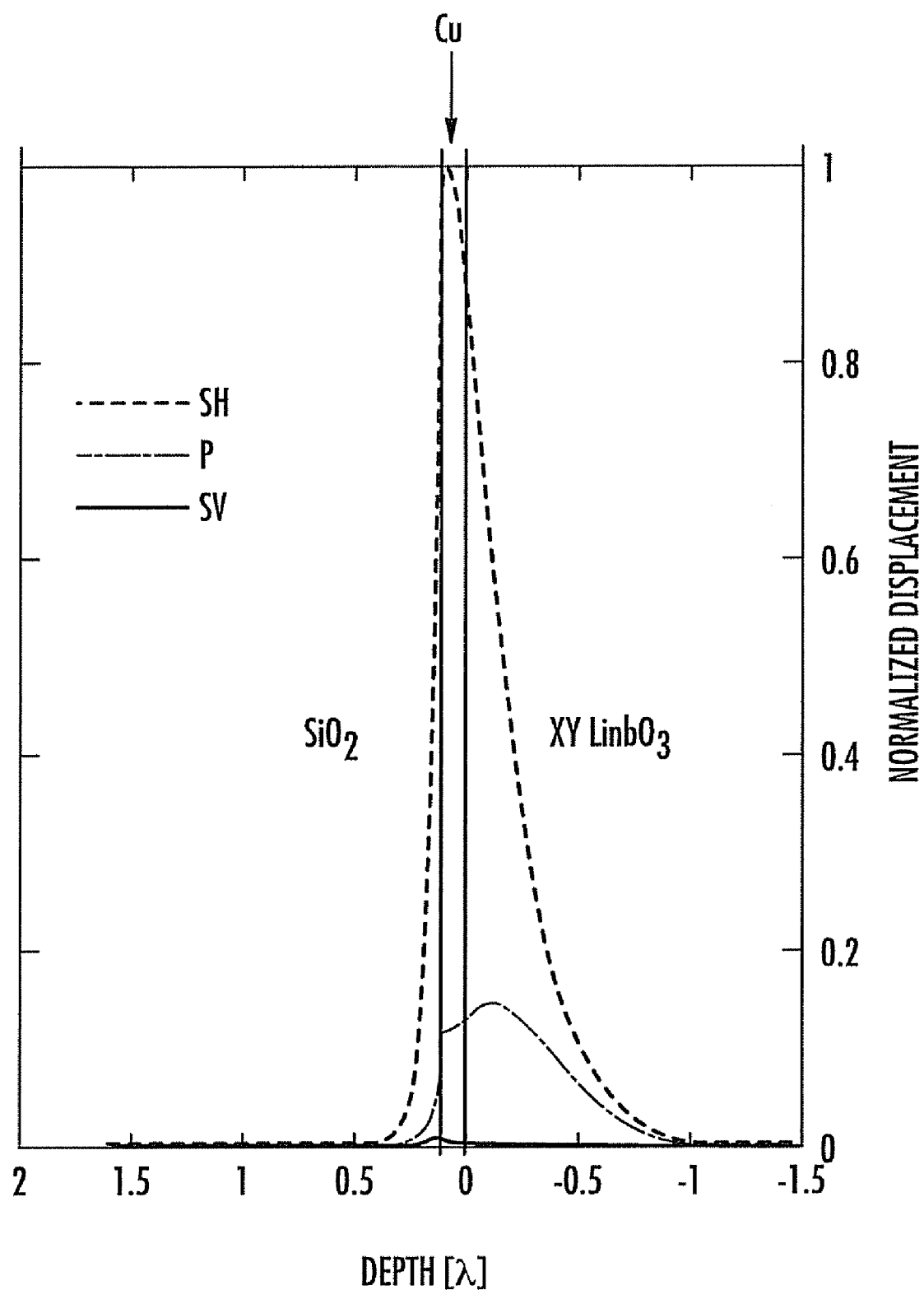
FIG. 21 illustrates a decay of a polarization's displacement for the embodiment of FIG. 20.
Figure 22:
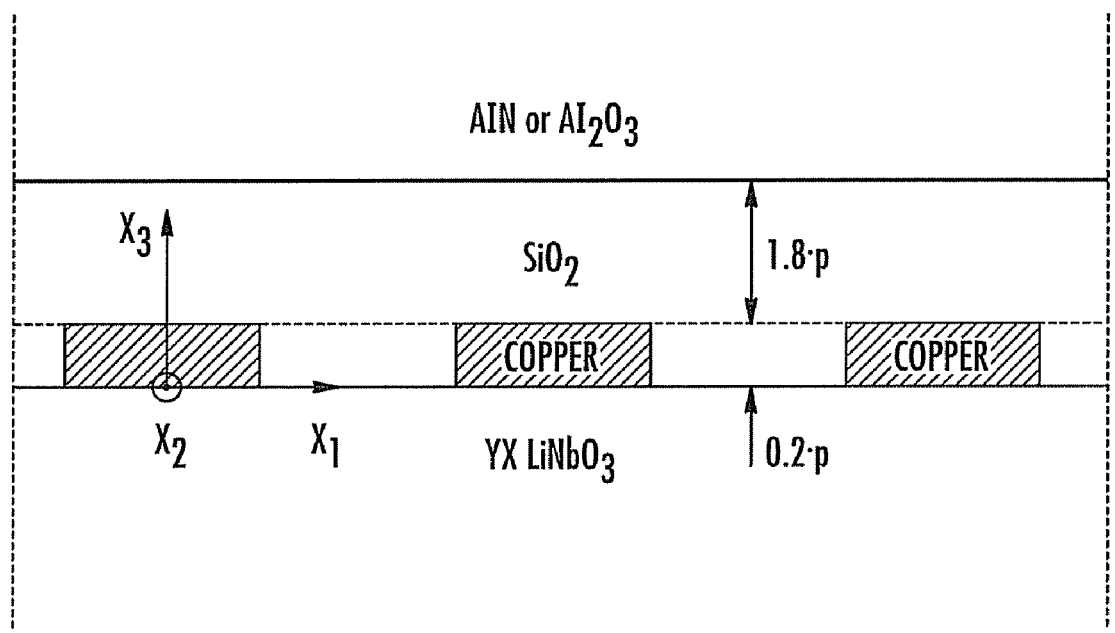
FIG. 22 is a diagrammatical illustration of one embodiment of a PBAW device for AlN-Slots/$SiO_2$/Cu-Electrode/YXLN.
Figure 23:
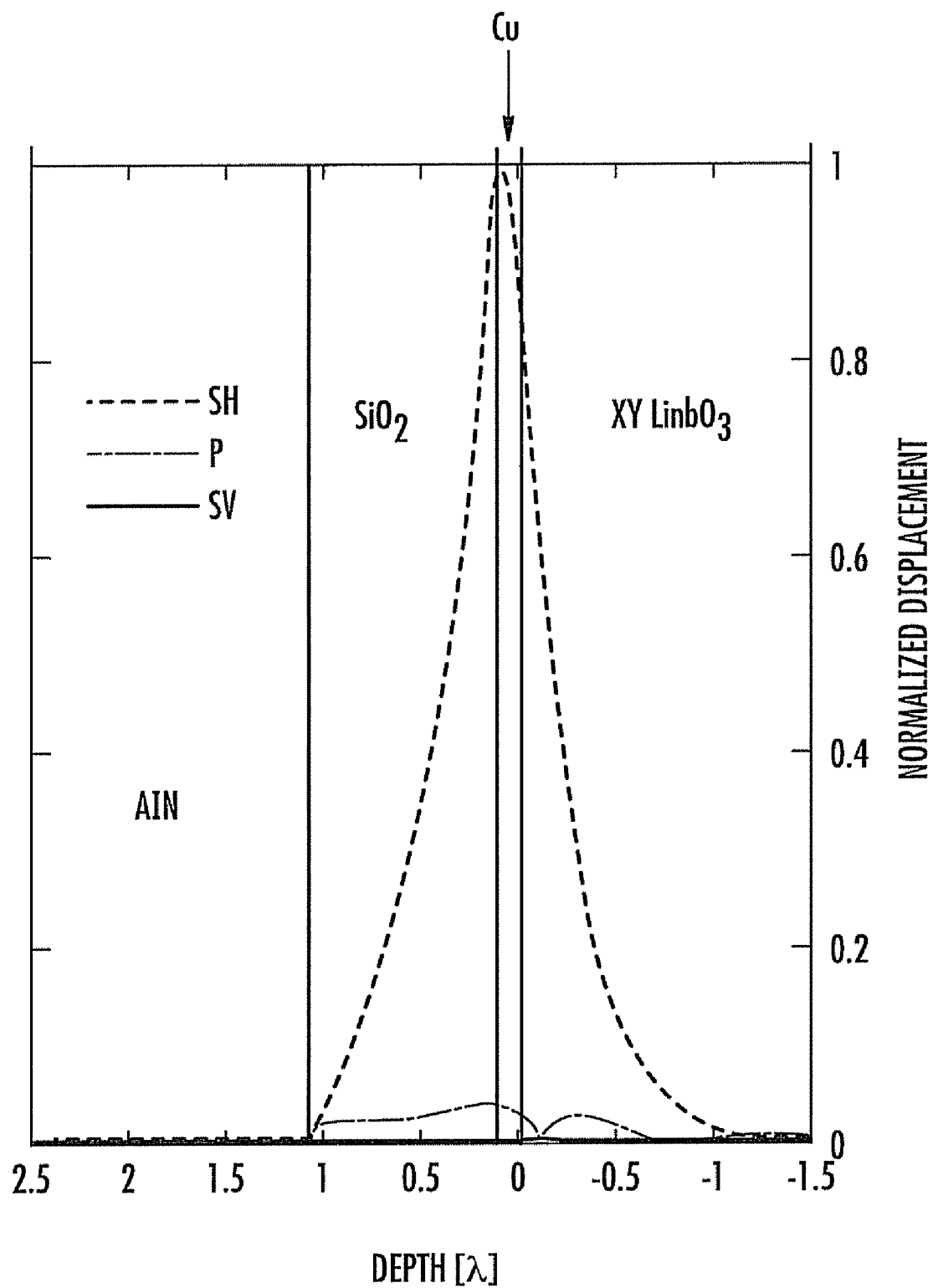
FIG. 23 illustrates the decay of the polarization's displacement for the embodiment of FIG. 22.

FIGS. 21 and 23 illustrate the polarizations and the decay of the displacements for physical embodiments in FIGS. 20 and 22. Comparing the decay of the displacements in FIGS. 20 and 22 with that of the pillar in FIG. 19, it may be concluded that the slotted embodiment produces a comparable or improved acoustic confinement.

In addition to providing access to the internal region of the device 10 for the purpose of frequency adjustment, the manufacturing process is less costly as it does not require excessive deposition of dielectrics.

Figure 24:
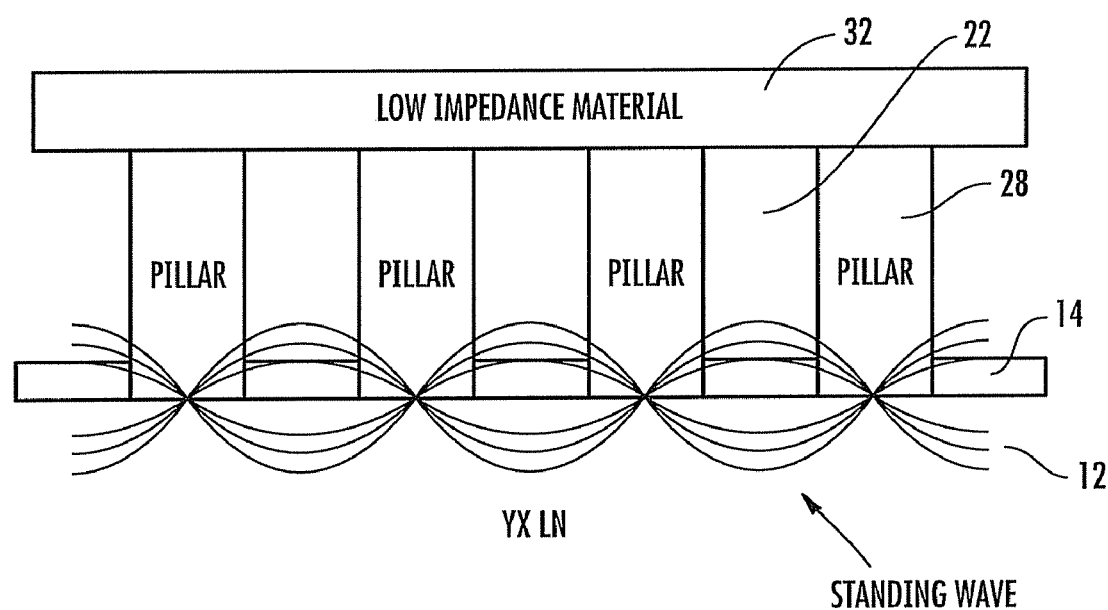
FIG. 24 is a diagrammatical illustration for an embodiment of the invention having a plurality of pillars, wherein a simplified acoustic SH standing wave at the surface of the YX LN is illustrated.
Figure 25:
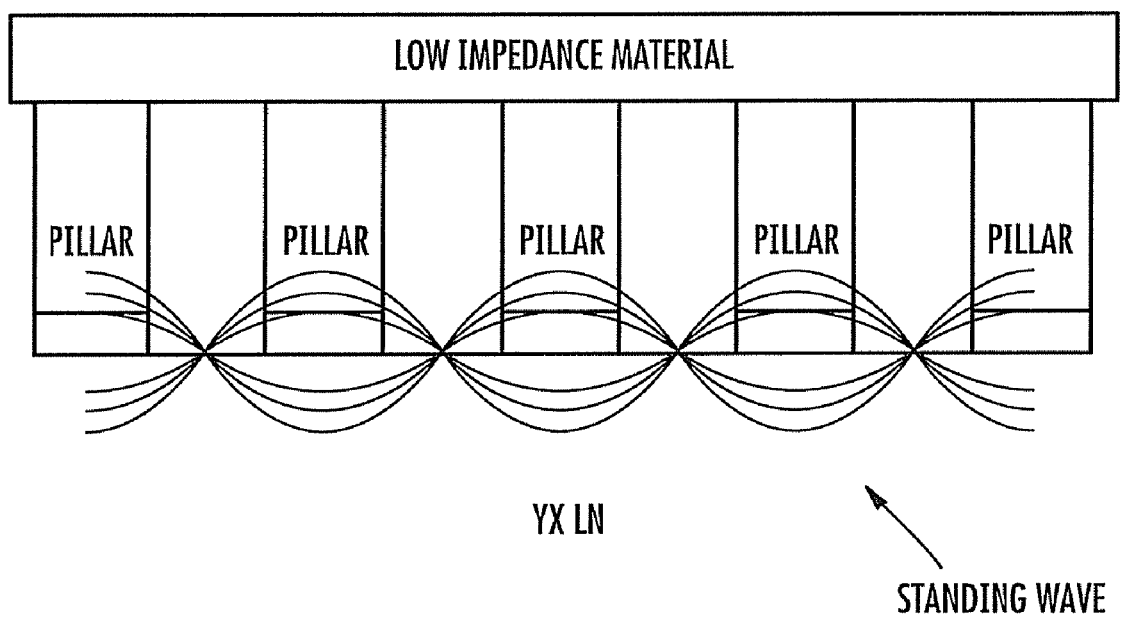
FIG. 25 is a diagrammatical illustration of an embodiment having a plurality of pillars, each coincident with an electrode, accompanied by a simplified illustration of an acoustic SH standing wave at the surface of the YX LN.

To ensure the acoustic field at the base 28b of the pillar 28 is orthogonal to the "zeroeth" order mode of the pillar, the piezoelectric substrate 12 and its orientation must be properly specified, and the pillars 28 must be properly positioned. FIG. 24 illustrates desirable positioning of the pillars 28 for a quasi-SH mode on YX LN. FIG. 25 illustrates a positioning that would result in maximum coupling to the pillar's zeroeth order mode. The structures illustrated with reference to FIGS. 24 and 25 are dependent upon the acoustic field having maximum acoustic displacement in the center of the electrode. SH acoustic waves on YX LN generally exhibit this characteristic. The same result is found for YX LT in which the SH mode is the dominant one and its amplitude is maximum at the center of the electrode.

As the polarization of the wave is dependent upon both the crystal, its orientation and the physical embodiment of the structure on its surface, the specification for the placement of pillars with respect to the electrodes will depend upon these factors.

Waves with polarization in the sagittal plane can also be used. As for shear horizontal waves, modes can propagate in the pillars. These modes so called "Lamb modes" are described in the Book [Royer-Dieulesaint].

[D. Royer, E. Dieulesaint, "Elastic Waves in Solids I; Free and Guided Propagation," Springer, section 5.5]

The dispersion equation is more complicated than for SH modes, but can be computed. The variable, $\alpha$, determines the symmetry of the mode. The following dispersion relation is obtained in the case of isotropic material:

$$\frac{\omega^4}{c_{44}^2}\rho^2 = 4k^2 q^2 \left[1 - \frac{p\tan(pw+\alpha)}{q\tan(qw+\alpha)}\right] \alpha = 0 \text{ or } \frac{\pi}{2} \qquad \text{eqn. (3)}$$

$$p^2 = \omega^2 \frac{\rho}{c_{11}} - k^2 \quad q^2 = \omega^2 \frac{\rho}{c_{44}} - k^2$$

Two modes always exist for any frequency and electrode width. These modes, noted S0 and A0, are respectively a mode with a displacement symmetric in the x3 direction and almost constant and a flexion mode with a displacement antisymmetric only in the x1 direction.

Figures 26A, 26B:
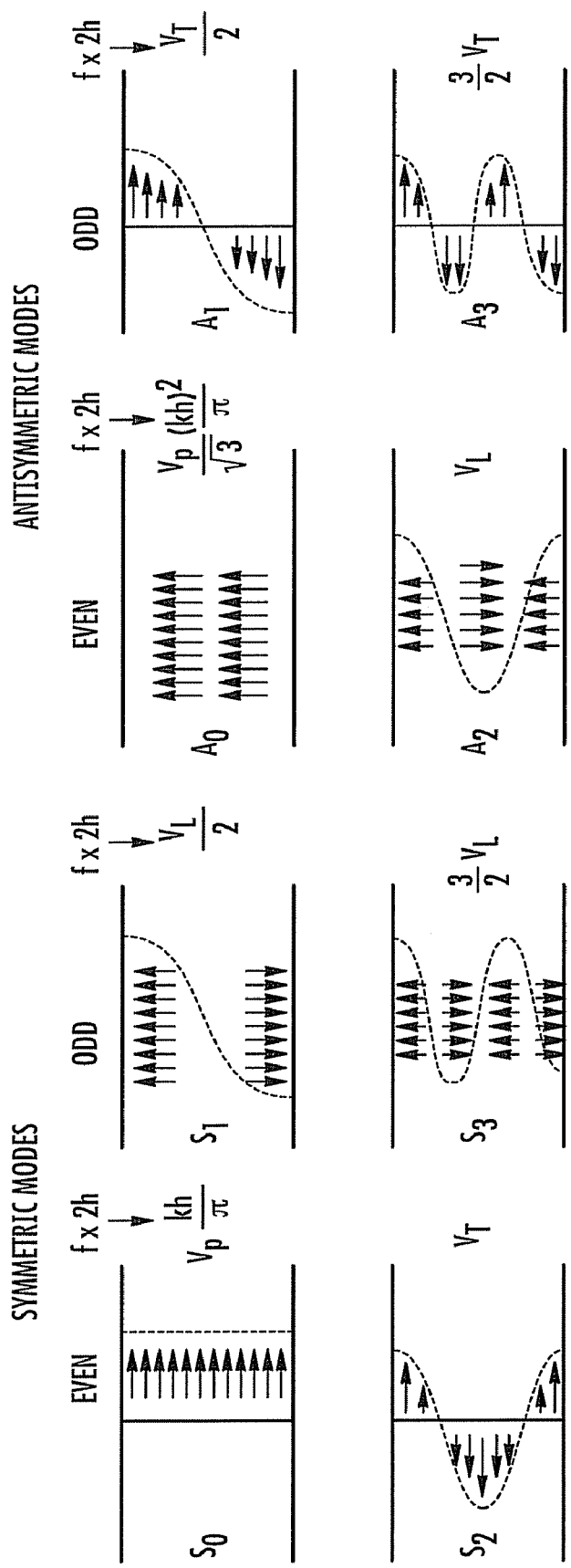
FIG. 26 illustrates polarizations of symmetric and antisymmetric sagittaly polarized Lamb modes.
Figure 27:
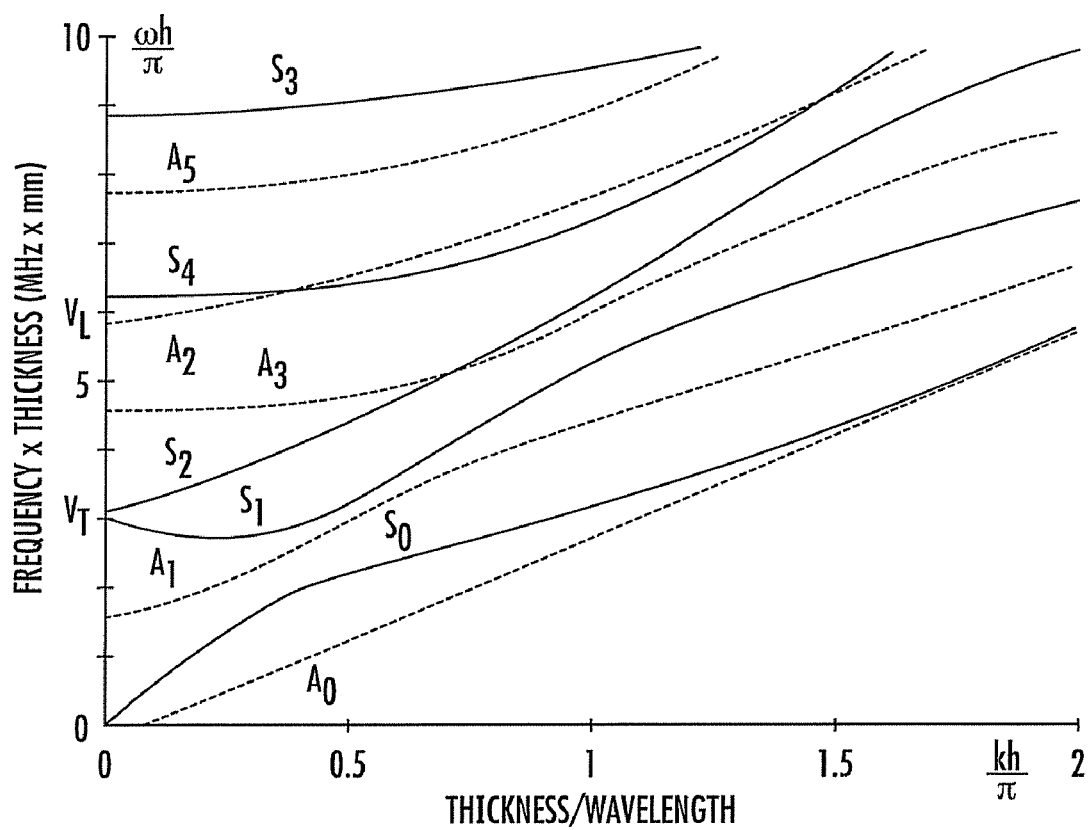
FIG. 27 illustrates dispersion of the sagittally polarized Lamb modes.

FIG. 26 illustrates the polarization of these lamb modes. FIG. 27 illustrates the dispersion relation, eqn (3).

As for the SH case, the coupling to these modes can be reduced by optimizing the configuration so that the displacement on the substrate is orthogonal to these modes. The other modes exist only above a given frequency. The lowest mode exists only when the product frequency/width is greater than half the shear wave velocity in the dielectric material. If the dielectric material is of Silicon Oxide, this product has to be greater than about 1730 m/s. It means that for a 1 GHz frequency, this mode can exist only if the width is greater than 1.73 μm. In practical cases, these modes will always be evanescent.

Embodiments of the invention desirably include pillar heights 28d greater than a quarter wavelength to ensure the decay of the evanescent acoustic field, and do not favor excessive heights. By way of example, as the aspect ratios become extreme, frequency adjustment will become increasingly difficult, and more time and expense will be required to deposit the oxides and to pattern the slots.

Figure 28:
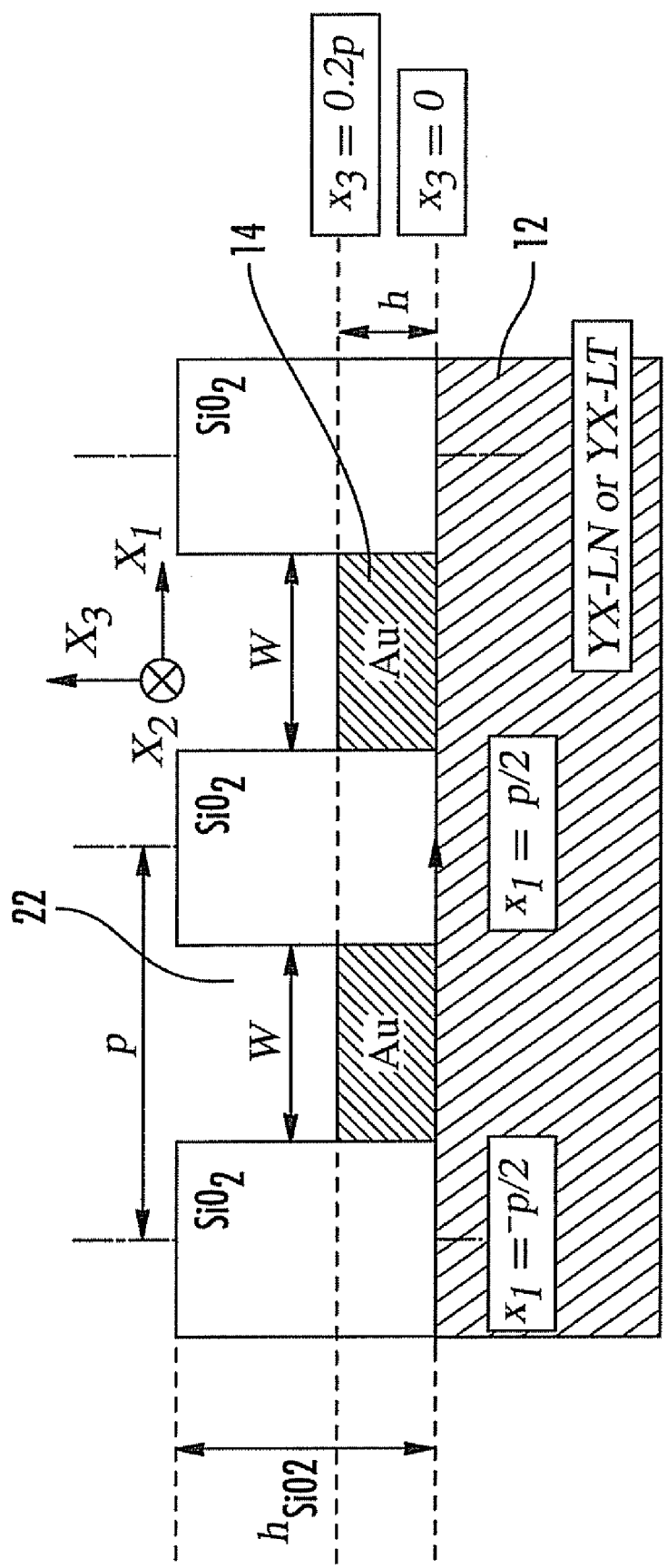
FIG. 28 illustrates an embodiment with Au electrodes and SiO2 as the dielectric layers.

FIG. 28 illustrates one embodiment of the present invention comprising Au electrodes and SiO2 as the dielectric layers. The slots 22 are located directly above the electrodes 14. The temperature coefficient of velocity which is a function of the temperature coefficient of frequency is plotted as a function of dielectric layer for both YX-LN and YX LT. When the dielectric thickness is greater than 0.5 p, the substrate LT TCV stabilizes at 1.5 ppm while that of LN at −22 ppm. Thus, LT exhibits a better temperature characteristic but has a lower coupling coefficient. For a desirable TCF, a layer of SiOx between the electrode layer and the slotted body will generally be employed, as illustrated with reference to FIG. 30. Typically, the first dielectric overcoat may a thickness range of 0 to 0.75 p above the electrode.

Figure 30:
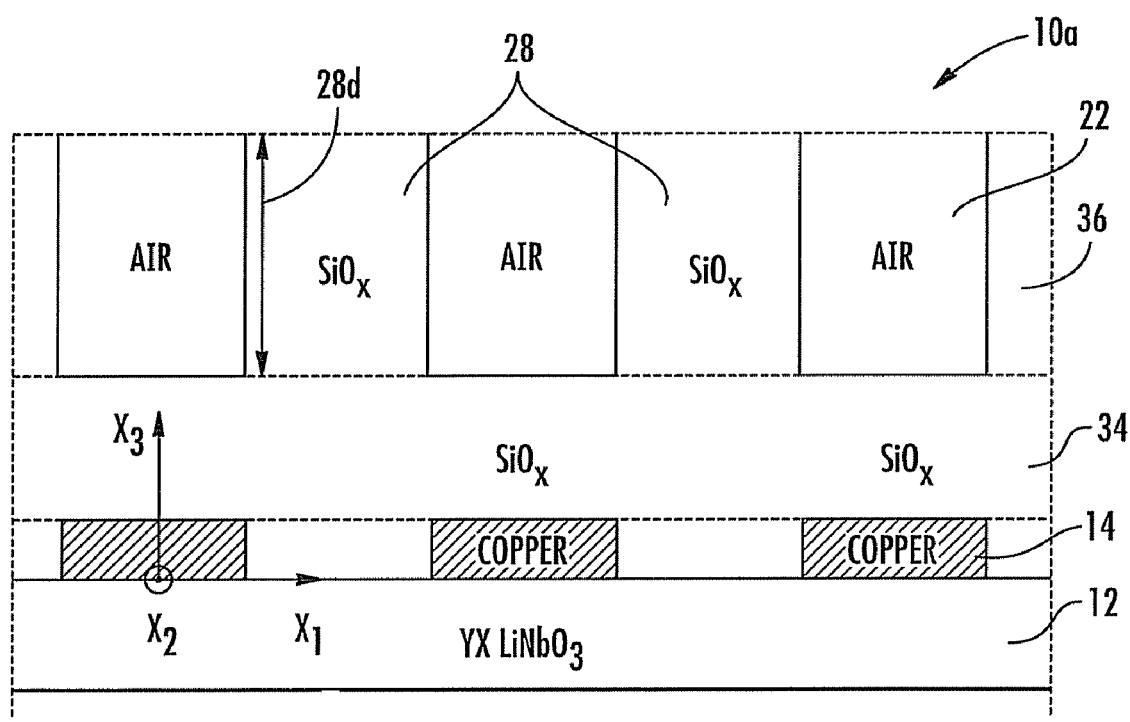
FIG. 30 is a diagrammatical illustration of an alternative embodiment wherein some amount of SiOx remains over the electrode and below the slotted SiOx dielectric body.

The embodiment illustrated with reference to FIG. 30, may be described as an acoustic wave device 10a comprising the piezoelectric substrate 12 and the plurality of electrodes 14 formed on the surface 16 of the piezoelectric substrate. The dielectric overcoat 20 earlier described with reference to FIG. 14 is now constructed to be a first dielectric overcoat 34 extending between and over the electrodes 14 and a second dielectric overcoat 36 extending over the first dielectric overcoat. The second dielectric overcoat 36 includes the plurality of slots 22. The slots 22 are located above the electrodes 14.

Figure 31:
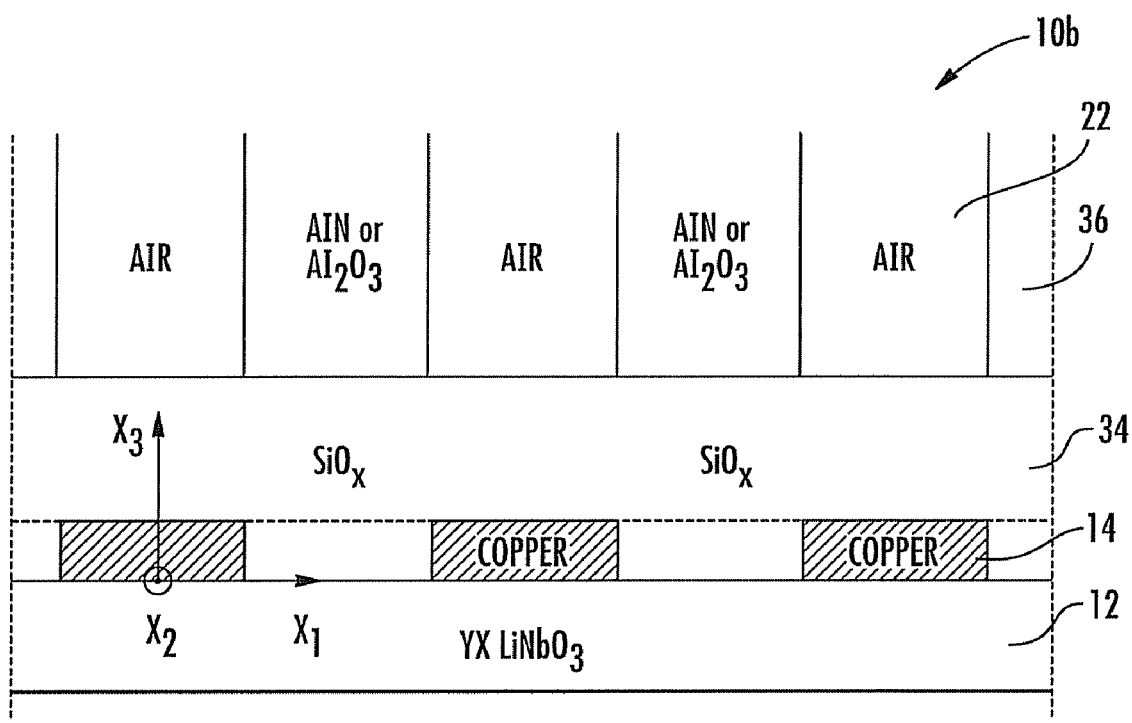
FIG. 31 is a diagrammatical illustration of an alternate embodiment, wherein some amount of SiOx remains over electrodes and below the slotted high velocity dielectric body.

Further, there is no hard requirement that the pillars 28 be constructed of SiOx. The relative control of the pillar height 28d is improved by selecting higher velocity materials. An example of one such embodiment is illustrated with reference to FIG. 31.

Figure 32:
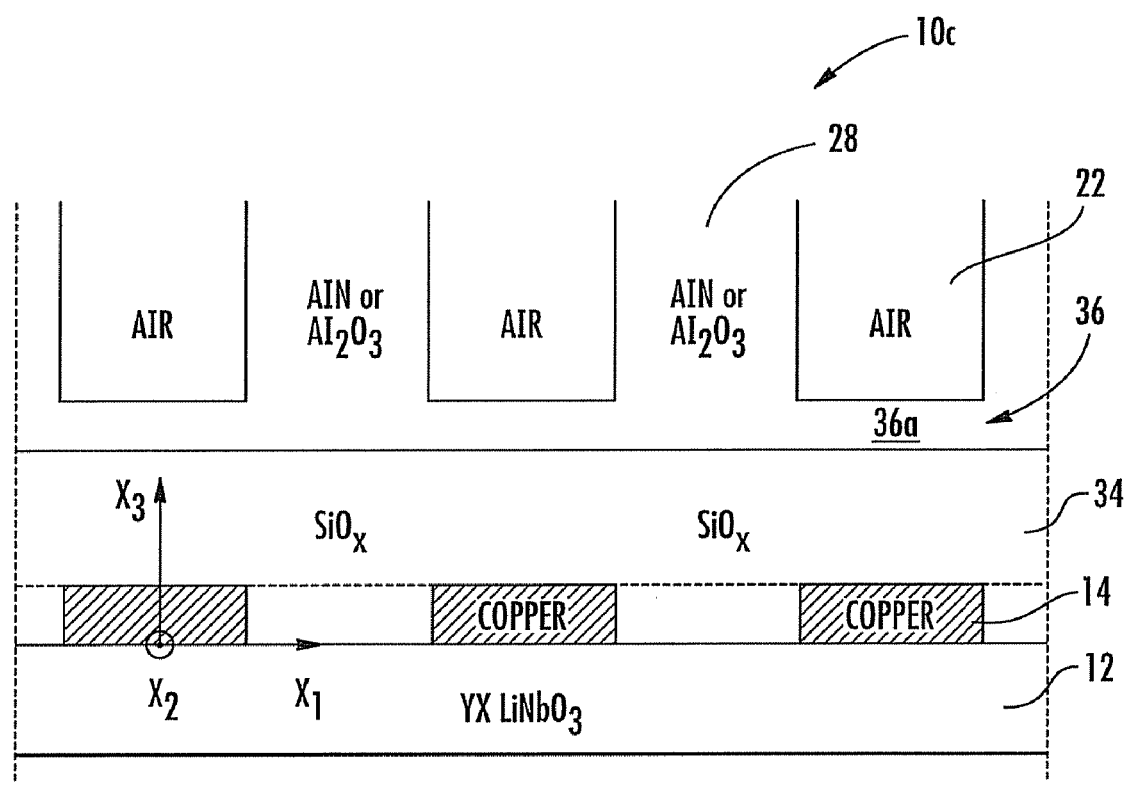
FIG. 32 is a diagrammatical illustration of an alternate embodiment, wherein some amount of the high velocity dielectric and SiOx remains over the electrodes and below the slotted high velocity dielectric body.
Figure 33:
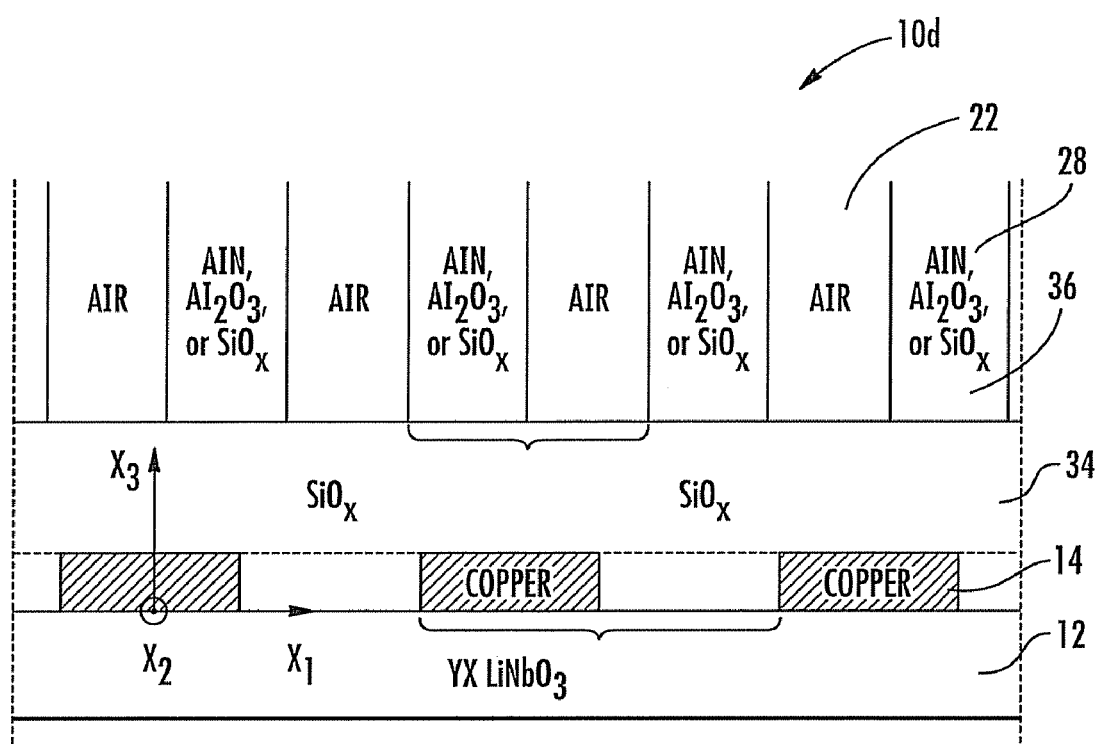
FIG. 33 is a diagrammatical illustration of an embodiment, wherein the period of the pillars/slots is less than that of the IDT.

Alternate embodiments of the invention will now come to the mind of those skilled in the art having the benefit of the teachings of the present invention. By way of example, and with reference to FIGS. 32-34, diagrammatical illustrations of alternate embodiments are presented as devices 10b and 10c. By way of example and as illustrated with reference to FIG. 32, some amount 36a of the high velocity dielectric 36 and SiOx 34 remains over the electrodes 12 and below the slotted high velocity dielectric 36. In FIG. 33, the device 10d includes a period 38 of the pillars 28 and slots 24 is less than the period 40 of the electrodes 14 of the IDT 18.

Figure 34:
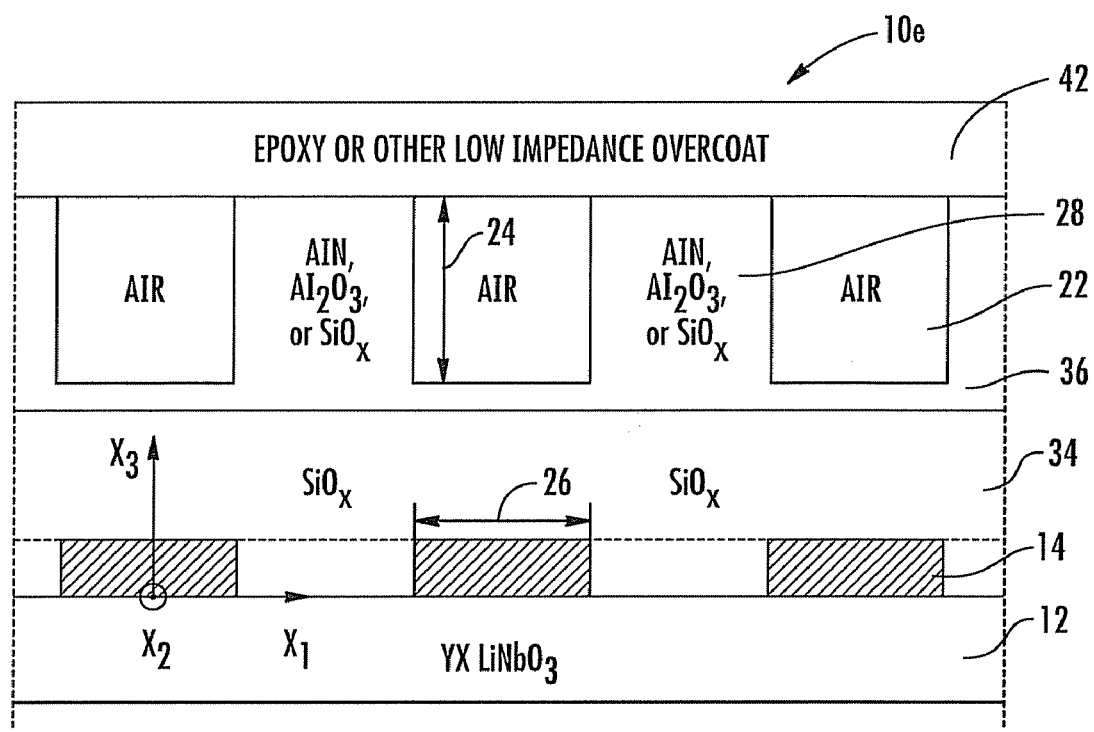
FIG. 34 is a diagrammatical illustration or yet another embodiment according to the teachings of the present invention, the embodiment including a low impedance overcoat.

By way of further example, and with reference to FIG. 34, the device 10e comprises the first dielectric overcoat 34 extending between and above the electrodes 14, the second dielectric overcoat 36 having the slots 22 therein, and a third dielectric overcoat or layer 42 deposited above the second overcoat. For the embodiment herein described by way of example, the depth dimension 24 of each of the slots 22 is at least equal to the width dimension 26 of each of the electrodes 14. In addition, the impedance of the third dielectric layer 42 is comparatively lower than that of the second dielectric overcoat 36.

Many modifications and other embodiments of the invention will come to the mind of one skilled in the art having the benefit of the teachings presented in the foregoing descriptions and associated drawings. Therefore, it is understood that the invention is not to be limited to the specific embodiments disclosed, and that modifications and embodiments are intended to be included within the scope of the appended claims.

That which is claimed is:

1. An acoustic wave device comprising:
a piezoelectric substrate;
a plurality of electrodes formed on a surface of the piezoelectric substrate;
a first dielectric overcoat extending at least between some of the plurality of electrodes; and
a second dielectric overcoat extending over the first dielectric overcoat, the second dielectric overcoat having a plurality of slots, wherein the slots are located above the plurality of the electrodes, and wherein a depth dimension of each of the plurality of slots is at least equal to a width dimension of each of the plurality of electrodes.

2. The device according to claim 1, wherein the slots are located directly above the plurality of the electrodes.

3. The device according to claim 1, wherein each of the plurality of electrodes comprises a density greater than a density of each of the first and second overcoats.

4. The device according to claim 1, wherein the first and second dielectric overcoats are formed from a similar material.

5. The device according to claim 1, wherein the first dielectric overcoat comprises $SiO_x$.

6. The device according to claim 1, wherein the plurality of electrodes comprises a resonator structure.

7. The device according to claim 1, wherein the first dielectric overcoat comprises a positive TCF.

8. The device according to claim 1, wherein the second dielectric overcoat comprises at least one of AlN, $SiO_x$ and $Al_2O_3$.

9. The device according to claim 1, wherein the substrate comprises at least one of lithium tantalate and lithium niobate.

10. The device according to claim 1, wherein the substrate comprises a piezoelectric crystal.

11. The device according to claim 1, further comprising a low impedance material carried above the second dielectric overcoat.

12. The device according to claim 11, wherein the low impedance material comprises an epoxy.

13. The device according to claim 1, wherein the plurality of slots within the second dielectric overcoat forms a series of recurring pillars and slots.

14. The device according to claim 13, wherein the plurality of electrodes forms an interdigital transducer, and wherein a period for the pillars and slots is less than a period for the interdigital transducer.

15. An acoustic wave device comprising:
a piezoelectric substrate;
a plurality of electrodes formed on a surface of the piezoelectric substrate;
a first dielectric overcoat extending at least between some of the plurality of electrodes, wherein the first dielectric overcoat comprises a thickness above each electrode ranging from 0 p to 0.75 p; and
a second dielectric overcoat extending over the first dielectric overcoat, the second dielectric overcoat having a plurality of slots, wherein the slots are located above the plurality of the electrodes.

16. The device according to claim 15, wherein each of the plurality of slots extends directly above each of the plurality of electrodes, thus each electrode having a slot thereabove within the second overcoat.

17. The device according to claim 15, wherein the first dielectric overcoat comprises a positive TCF.

18. A surface acoustic wave device comprising:
- a piezoelectric substrate;
- an electrode pattern provided on a surface of the piezoelectric substrate, wherein the electrode pattern forms a resonator;
- a first dielectric overcoat with significant SiOx content, the dielectric overcoat having a positive TCF, the first dielectric overcoat disposed between and over electrodes of the electrode pattern, wherein the first dielectric overcoat has thickness over the electrode pattern in a range between 0.00 p and 0.75 p, and
- a second dielectric overcoat extending above the first dielectric overcoat, the second dielectric overcoat having slots therein, wherein the slots extend above the electrodes.

19. The device according to claim 18, wherein the slots are located directly above the plurality of the electrodes.

20. The device according to claim 18, wherein each of the slots in the second dielectric overcoat has a depth dimension at least approximately equal to a width dimension of an electrode.

21. The device according to claim 18, wherein a density of material comprising each electrode substantially exceeds the density of each of the first and second dielectric overcoats.

22. The device according to claim 18, wherein SiOx refers to a dielectric comprised of silicon and oxygen, and wherein "x" is nominally 2 and varied provided a positive TCF is preserved.

23. The device according to claim 18, wherein the single crystal of a piezoelectric substrate is $LiNbO_3$.

24. An acoustic wave device comprising:
- a piezoelectric substrate;
- a plurality of electrodes formed on a surface of the piezoelectric substrate; and
- a dielectric overcoat extending at least between and above some of the plurality of electrodes, wherein a plurality of slots are located above the plurality of the electrodes, and wherein a depth dimension of each of the plurality of slots is at least equal to a width dimension of each of the plurality of electrodes.

25. The device according to claim 24, wherein each of the plurality of electrodes comprises a density greater than a density of the dielectric overcoat.

26. The device according to claim 24, wherein the dielectric overcoat comprises $SiO_x$.

27. The device according to claim 24, wherein the plurality of electrodes comprises a resonator structure.

28. The device according to claim 24, wherein the dielectric overcoat comprises a thickness above each electrode ranging from 0 p to 0.75 p.

29. The device according to claim 24, wherein the dielectric overcoat comprises a positive TCF.

30. The device according to claim 24, wherein each of the plurality of slots extends directly above each of the plurality of electrodes, thus each electrode having at least a portion of the slot thereabove.

31. The device according to claim 24, wherein the substrate comprises at least one of lithium tantalate and lithium niobate.

32. The device according to claim 24, wherein the substrate comprises a piezoelectric crystal.

33. The device according to claim 24, further comprising a low impedance material carried above the dielectric overcoat.

34. The device according to claim 33, wherein the low impedance material comprises an epoxy.

35. An acoustic wave device comprising:
- a piezoelectric substrate;
- a plurality of electrodes formed on a surface of the piezoelectric substrate; and
- a first dielectric overcoat extending at least between some of the plurality of electrodes,
- a second dielectric overcoat comprising a plurality of slots, and wherein a depth dimension of each of the plurality of slots is at least equal to a width dimension of each of the plurality of electrodes;
- a third dielectric layer deposited on top of the second overcoat wherein the impedance of the third dielectric layer is comparatively lower than that of the second dielectric overcoat.

* * * * *